United States Patent
Ida et al.

(10) Patent No.: US 6,709,890 B2
(45) Date of Patent: Mar. 23, 2004

(54) METHOD OF MANUFACTURING SEMICONDUCTOR INTEGRATED CIRCUIT DEVICE

(75) Inventors: Tsutomu Ida, Komoro (JP); Akio Ishizu, Chiisagata (JP); Masakazu Hashizume, Kitasaku (JP); Isao Hagiwara, Komoro (JP); Yoshinori Shiokawa, Komoro (JP)

(73) Assignees: Renesas Technology Corporation, Tokyo (JP); Hitachi Tobu Semiconductor Ltd., Takasaki (JP)

(*) Notice: Subject to any disclaimer, the term of this patent is extended or adjusted under 35 U.S.C. 154(b) by 0 days.

(21) Appl. No.: 09/783,605

(22) Filed: Feb. 15, 2001

(65) Prior Publication Data

US 2001/0014490 A1 Aug. 16, 2001

(30) Foreign Application Priority Data

Feb. 15, 2000 (JP) ........................................ 2000-036820

(51) Int. Cl.[7] .......................... H01L 21/44; H01L 21/48; H01L 21/50; H01L 23/34; H01L 23/48; H01L 23/52; H01L 29/40
(52) U.S. Cl. ........................ 438/109; 257/728; 257/777
(58) Field of Search ................. 438/109, 612; 257/528, 728, 777; 228/180.1, 180.21

(56) References Cited

U.S. PATENT DOCUMENTS 3,574,925 A * 4/1971 Schneider et al. ............ 29/487
3,791,018 A * 2/1974 Johnston et al. ........... 29/471.1
4,605,152 A * 8/1986 Fridman ...................... 228/6.2
5,927,589 A    7/1999 Yang

FOREIGN PATENT DOCUMENTS

JP          11121921         4/1999

OTHER PUBLICATIONS

Harper, et al., "Electronic Packaging, Microelectronics, and Interconnection Dictionary," 1993. p. 156.*

* cited by examiner

Primary Examiner—Carl Whitehead, Jr.
Assistant Examiner—Nema Berezny
(74) Attorney, Agent, or Firm—Antonelli, Terry, Stout & Kraus, LLP

(57) ABSTRACT

In a method of manufacturing a high frequency module to be assembled by providing, on a wiring board, a chip part and a semiconductor pellet to be bare chip mounted and then mounting the chip part and the semiconductor pellet through soldering, the wiring board is separated from a heat block with the semiconductor pellet pressurized against the wiring board in a main heating portion heating and melting a reflow solder, thereby cooling a soldering portion. Consequently, the generation of a void in the soldering portion can be prevented and the connecting reliability of the soldering portion can be enhanced. In addition, a degree of mounting horizontality of the semiconductor pellet on the wiring board can be enhanced.

23 Claims, 17 Drawing Sheets

METHOD OF MANUFACTURING SEMICONDUCTOR INTEGRATED CIRCUIT DEVICE

TECHNICAL FIELD OF THE INVENTION

The present invention relates to a semiconductor manufacturing technique, and more particularly to an effective technique which is applicable to solder connection during semiconductor pellet mounting in an assembly of a high frequency module (a high frequency power amplifier).

BACKGROUND OF THE INVENTION

For example, Japanese Patent Laid-Open Publication No. 11-121921 (Machida et al.) has described a technique for a solder connecting method to be used when a semiconductor pellet is to be mounted on a board, wherein the back side on which the semiconductor pellet is mounted is supported by a frog-shaped pin during reflow step (solder connection).

Moreover, A high frequency power amplifier referred to as a high frequency module (also referred to as an RF module) has been known as a semiconductor integrated circuit device in which surface mounting type electronic parts such as a chip capacitor or a chip resistor and a semiconductor pellet for bare chip mounting are mounted on a printed circuit board and are thus assembled.

In the reflow mounting of the electronic parts and the semiconductor pellet in the assembly of the high frequency module on the printed circuit board, however, a void is generated in a solder connecting portion of the semiconductor pellet. As a result, detective solder connection is caused.

Furthermore, the semiconductor pellet is inclined and mounted during the solder connection. As a result, a height of a pad to be a surface electrode of the semiconductor pellet becomes nonuniform. Consequently, there is a problem in that bonding failures are caused during wire bonding.

SUMMARY OF THE INVENTION

It is an object of the present invention to provide a method of manufacturing a semiconductor integrated circuit device which can enhance connecting reliability of a solder connecting portion by removing a void formed in the solder connecting portion.

It is another object of the present invention to provide a method of manufacturing a semiconductor integrated circuit device which can enhance a degree of mounting horizontality for a printed circuit board of a semiconductor pellet.

Furthermore, it is yet another object of the present invention to provide a method of manufacturing a semiconductor integrated circuit device which can prevent a bad influence on wire bonding by removing soldering foreign substances scattered through melting.

It is a further object of the present invention to provide a method of manufacturing a semiconductor integrated circuit device which can reduce a thermal stress applied on the semiconductor integrated circuit device by collectively carrying out reflowing on the semiconductor pellet and surface mounting type electronic parts.

It is a further object of the present invention to provide a method of manufacturing a semiconductor integrated circuit device which can collectively carry out reflowing on the semiconductor pellet and the surface mounting type electronic parts, thereby simplifying the reflow step.

The present invention provides a method of manufacturing a semiconductor integrated circuit device, wherein a wiring board, a surface mounting type electronic part and a semiconductor pellet to be bare chip mounted are soldered to mount the electronic part and the semiconductor pellet on the wiring board, thereby carrying out an assembly, the method comprising the steps of providing the electronic part and the semiconductor pellet on the wiring board, heating and melting a connecting solder provided between the semiconductor pellet and the wiring board while pressurizing the semiconductor pellet against the wiring board in a heating portion capable of carrying out solder melting, and cooling a soldering portion of the semiconductor pellet and the wiring board to solder the wiring board, the electronic part and the semiconductor pellet with the semiconductor pellet pressurized against the wiring board in the heating portion.

In the method of manufacturing a semiconductor integrated circuit device according to the present invention, when the solder connecting portion is to be cooled in the heating portion, the wiring board is separated from a heat block provided in the heating portion, thereby cooling the soldering portion.

In the method of manufacturing a semiconductor integrated circuit device according to the present invention, when the amount of the pressurization of the semiconductor pellet is to be changed during the heating and melting operation of the connecting solder, the pressurization is carried out and is not carried out repeatedly so as to change the amount of the pressurization.

According to the present invention, the soldering portion is cooled with the semiconductor pellet pressurized against the wiring board. Consequently, the cooling can be carried out with the soldering portion pressurized.

Accordingly, the generation of a void in the soldering portion can be prevented. As a result, the connecting reliability of the soldering portion can be enhanced.

Furthermore, the soldering portion is cooled with the semiconductor pellet pressurized against the wiring board. Consequently, the semiconductor pellet can be mounted horizontally on the wiring board. As a result, a degree of mounting horizontality of the semiconductor pellet can be enhanced.

Accordingly, bonding precision can be enhanced during wire bonding. As a result, bonding failures can be reduced.

In the heating portion, moreover, the soldering portion is cooled with the semiconductor pellet pressurized against the wiring board. Consequently, the soldering portion can be cooled in the heating place. Consequently, a cooling region can be decreased.

As a result, the size of a reflow device can be reduced so that a space can be saved.

Furthermore, the present invention provides a method of manufacturing a semiconductor integrated circuit device, wherein a wiring board, a surface mounting type electronic part and a semiconductor pellet to be bare chip mounted are soldered to mount the electronic part and the semiconductor pellet on the wiring board, thereby carrying out an assembly, the method comprising the steps of providing the electronic part and the semiconductor pellet on the wiring board, heating and melting a connecting solder provided between the semiconductor pellet and the wiring board while pressurizing the semiconductor pellet against the wiring board in a heating portion capable of carrying out solder melting, and changing an amount of the pressurization during the heating and melting, and cooling a soldering portion of the semiconductor pellet and the wiring board to solder the wiring board, the electronic part and the semiconductor pellet.

According to the present invention, the amount of the pressurization through the semiconductor pellet is changed during the heating and melting. Consequently, a pressure to be applied to the soldering portion during the melting is varied. Thus, a kinetic energy can be given to air in a void formed in the soldering portion.

As a result, the kinetic energy of the air in the void is activated and the soldering portion is pressurized. Consequently, the void can be pushed out.

Accordingly, the generation of a void in the soldering portion can be prevented. As a result, the connecting reliability of the soldering portion can be enhanced.

Moreover, the present invention provides a method of manufacturing a semiconductor integrated circuit device, wherein a wiring board, a surface mounting type electronic part and a semiconductor pellet to be bare chip mounted are soldered to mount the electronic part and the semiconductor pellet on the wiring board, thereby carrying out an assembly, the method comprising the steps of providing the electronic part and the semiconductor pellet on the wiring board, heating and melting a connecting solder provided between the semiconductor pellet and the wiring board while pressurizing the semiconductor pellet against the wiring board in a heating portion capable of carrying out solder melting, cooling a soldering portion of the semiconductor pellet and the wiring board to solder the wiring board, the electronic part and the semiconductor pellet, and sucking a soldering foreign substance scattered by the heating and melting, thereby removing the soldering foreign substance from the wiring board.

According to the present invention, the scattered soldering foreign substance is sucked and removed. Consequently, the soldering foreign substance is removed during the wire bonding. Therefore, it is possible to prevent bonding failures from being generated due to the soldering foreign substance.

Furthermore, the present invention provides a method of manufacturing a semiconductor integrated circuit device, wherein a surface mounting type electronic part and a semiconductor pellet to be bare chip mounted are provided on a wiring board and are then mounted on the wiring board through soldering, thereby carrying out an assembly, the method comprising the steps of providing the electronic part and the semiconductor pellet on the wiring board having a connecting solder formed on a terminal, heating and melting the connecting solder through batch reflow while pressurizing the semiconductor pellet against the wiring board in a heating portion capable of carrying out solder melting, and cooling a soldering portion of the semiconductor pellet and the wiring board to solder the wiring board, the electronic part and the semiconductor pellet with the semiconductor pellet pressurized against the wiring board in the heating portion.

According to the present invention, the electronic part and the semiconductor pellet are subjected to batch reflow. Consequently, it is possible to decrease the number of times of application of a thermal stress on the semiconductor integrated circuit device. As a result, the quality of the semiconductor integrated circuit device can be enhanced.

By the batch reflow, furthermore, the reflow processing can be shortened. As a result, the reflow steps can be simplified.

By the bath reflow step, moreover, only one reflow device is enough. Therefore, an investment cost of the reflow steps can be reduced.

The present invention further provides a method of manufacturing a semiconductor integrated circuit device, comprising the steps of:

(a) providing a surface mounting type electronic part and a semiconductor pellet on a wiring board having a connecting solder formed on a terminal;

(b) heating and melting the connecting solder through batch reflow while pressurizing the semiconductor pellet against the wiring board in a heating portion capable of carrying out solder melting, and changing an amount of the pressurization during the heating and melting; and (c) cooling a soldering portion of the semiconductor pellet and the wiring board to solder the wiring board, the electronic part and the semiconductor pellet with the semiconductor pellet pressurized against the wiring board in the heating portion.

The present invention further provides a method of manufacturing a semiconductor integrated circuit device, comprising the steps of:

(a) providing a surface mounting type electronic part and a semiconductor pellet on a wiring board having a connecting solder formed on a terminal;

(b) heating and melting the connecting solder through batch reflow while pressurizing the semiconductor pellet against the wiring board in a heating portion capable of carrying out solder melting;

(c) cooling a soldering portion of the semiconductor pellet and the wiring board to solder the wiring board, the electronic part and the semiconductor pellet with the semiconductor pellet pressurized against the wiring board in the heating portion; and (d) sucking a soldering foreign substance scattered by the heating and melting, thereby removing the soldering foreign substance from the wiring board.

The present invention further provides a method of manufacturing a semiconductor integrated circuit device, comprising the steps of:

(a) providing a surface mounting type electronic part and a semiconductor pellet on a wiring board having a connecting solder formed on a terminal;

(b) heating and melting the connecting solder through batch reflow while pressurizing the semiconductor pellet against the wiring board in a heating portion capable of carrying out solder melting, and changing an amount of the pressurization during the heating and melting;

(c) cooling a soldering portion of the semiconductor pellet and the wiring board to solder the wiring board, the electronic part and the semiconductor pellet; and (d) sucking a soldering foreign substance scattered by the heating and melting, thereby removing the soldering foreign substance from the wiring board.

The present invention further provides a method of manufacturing a semiconductor integrated circuit device, comprising the steps of:

(a) providing a surface mounting type electronic part and a semiconductor pellet on a wiring board having a connecting solder formed on a terminal;

(b) heating and melting the connecting solder through batch reflow while pressurizing the semiconductor pellet against the wiring board in a heating portion capable of carrying out solder melting, and changing an amount of the pressurization during the heating and melting;

(c) cooling a soldering portion of the semiconductor pellet and the wiring board to solder the wiring board, the electronic part and the semiconductor pellet with the semiconductor pellet pressurized against the wiring board in the heating portion; and (d) sucking a soldering foreign substance scattered by the heating and melting, thereby removing the soldering foreign substance from the wiring board.

The present invention further provides a method of manufacturing a semiconductor integrated circuit device, comprising the steps of:
- (a) providing a surface mounting type electronic part and a plurality of semiconductor pellets on a wiring board having a connecting solder formed on a terminal;
- (b) heating and melting the connecting solder provided between the semiconductor pellet and the wiring board while pressurizing the semiconductor pellet against the wiring board from above the individual semiconductor pellets through a plurality of pin members corresponding to the semiconductor pellets in a heating portion capable of carrying out solder melting; and
- (c) cooling a soldering portion of the semiconductor pellet and the wiring board to solder the wiring board, the electronic part and the semiconductor pellet with the semiconductor pellet pressurized against the wiring board in the heating portion.

The present invention further provides a method of manufacturing a semiconductor integrated circuit device, comprising the steps of:
- (a) providing a multi-device board having a plurality of wiring boards having a connecting solder formed on a terminal in a heating portion capable of carrying out solder melting;
- (b) providing a surface mounting type electronic part and a semiconductor pellet on the wiring boards of the multi-device board in the heating portion;
- (c) heating and melting the connecting solder through batch reflow while pressurizing the semiconductor pellet against the wiring board in the heating portion; and
- (d) cooling a soldering portion of the semiconductor pellet and the wiring board to solder the wiring board, the electronic part and the semiconductor pellet with the semiconductor pellet pressurized against the wiring board in the heating portion.

The present invention further provides a method of manufacturing a semiconductor integrated circuit device, comprising the steps of:
- (a) providing a multi-device board having a plurality of ceramic boards to be wiring boards having a connecting solder formed on a terminal in a heating portion capable of carrying out solder melting;
- (b) providing a surface mounting type electronic part and a semiconductor pellet on the ceramic boards of the multi-device board in the heating portion;
- (c) heating and melting the connecting solder through batch reflow while pressurizing the semiconductor pellet against the ceramic board in the heating portion; and
- (d) cooling a soldering portion of the semiconductor pellet and the wiring board to solder the ceramic board, the electronic part and the semiconductor pellet with the semiconductor pellet pressurized against the ceramic board in the heating portion.

The present invention further provides a method of manufacturing a semiconductor integrated circuit device, comprising the steps of:
- (a) providing a semiconductor pellet on a wiring board having a connecting solder formed on a terminal;
- (b) heating and melting the connecting solder through reflow while pressurizing the semiconductor pellet against the wiring board in a heating portion capable of carrying out solder melting; and
- (c) cooling a soldering portion of the semiconductor pellet and the wiring board to solder the wiring board and the semiconductor pellet with the semiconductor pellet pressurized against the wiring board in the heating portion.

The present invention further provides a method of manufacturing a semiconductor integrated circuit device, comprising the steps of:
- (a) providing a surface mounting type electronic part and a sheet-shaped heat radiating plate on a wiring board having a connecting solder formed on a terminal;
- (b) heating and melting the connecting solder through batch reflow while pressurizing the heat radiating plate against the wiring board in a heating portion capable of carrying out solder melting;
- (c) cooling a soldering portion of the heat radiating plate and the wiring board to solder the wiring board, the electronic part and the heat radiating plate with the heat radiating plate pressurized against the wiring board in the heating portion; and
- (d) mounting a semiconductor pellet on the heat radiating plate after connecting the heat radiating plate.

The present invention further provides a method of manufacturing a semiconductor integrated circuit device, comprising the steps of:
- (a) providing a surface mounting part and an integrated circuit pellet on a wiring board; and
- (b) pressurizing and cooling the integrated circuit pellet to carry out reflow in a heating portion when the reflow of the surface mounting part and the integrated circuit is to be performed.

The present invention further provides a method of manufacturing a semiconductor integrated circuit device, comprising the steps of:
- (a) providing a surface mounting part and an integrated circuit pellet on a wiring board; and
- (b) changing a pressure against the wiring board of the integrated circuit pellet during heating and melting to carry out reflow when the reflow of the surface mounting part and the integrated circuit is to be performed.

The present invention further provides a method of manufacturing a semiconductor integrated circuit device, comprising the steps of:
- (a) providing a surface mounting part and an integrated circuit pellet on a wiring board; and
- (b) pressurizing and cooling the integrated circuit pellet to carry out simultaneous solder reflow on the surface mounting part and the integrated circuit pellet when the solder reflow of the surface mounting part and the integrated circuit pellet is to be performed.

The present invention further provides a method of manufacturing a semiconductor integrated circuit device, comprising the steps of:
- (a) providing a surface mounting part and an integrated circuit pellet on a wiring board; and
- (b) sucking a soldering foreign substance scattered by heating and melting to carry out simultaneous solder reflow of the surface mounting part and the integrated circuit pellet when the solder reflow of the surface mounting part and the integrated circuit pellet is to be performed.

The summary of other inventions of the present application will be described in the following items:

1. A method of manufacturing a semiconductor integrated circuit device, wherein a surface mounting type electronic part and a semiconductor pellet to be bare chip mounted are provided on a wiring board and are then mounted on the wiring board through soldering, thereby carrying out an assembly, the method comprising the steps of:
   (a) providing the electronic part and a semiconductor pellet on a wiring board having a connecting solder formed on a terminal;
   (b) heating and melting the connecting solder through batch reflow while pressurizing the semiconductor pellet against the wiring board in a heating portion capable of carrying out solder melting; and
   (c) cooling a soldering portion of the semiconductor pellet and the wiring board to solder the wiring board, the electronic part and the semiconductor pellet with the semiconductor pellet pressurized against the wiring board in the heating portion,
   wherein the semiconductor pellet provided with a field effect transistor is mounted on the wiring board to assemble a high frequency module.

2. A method of manufacturing a semiconductor integrated circuit device, wherein a semiconductor pellet to be bare chip mounted is provided on a wiring board and is then mounted on the wiring board through soldering, thereby carrying out an assembly, the method comprising the steps of:
   (a) providing the semiconductor pellet on the wiring board having a connecting solder formed on a terminal;
   (b) heating and melting the connecting solder through reflow while pressurizing the semiconductor pellet against the wiring board in a heating portion capable of carrying out solder melting; and
   (c) cooling a soldering portion of the semiconductor pellet and the wiring board to solder the wiring board and the semiconductor pellet with the semiconductor pellet pressurized against the wiring board in the heating portion,
   wherein the semiconductor pellet provided with a field effect transistor is mounted on the wiring board to assemble a high frequency module.

3. A method of manufacturing a semiconductor integrated circuit device, wherein a surface mounting type electronic part and a sheet-shaped heat radiating plate are provided on a wiring board and are then mounted on the wiring board through soldering, and a semiconductor pellet capable of carry out bare chip mounting is thereafter mounted on the heat radiating plate, thereby performing an assembly, the method comprising the steps of:
   (a) providing the electronic part and the heat radiating plate on the wiring board having a connecting solder formed on a terminal;
   (b) heating and melting the connecting solder through batch reflow while pressurizing the heat radiating plate against the wiring board in a heating portion capable of carrying out solder melting;
   (c) cooling a soldering portion of the heat radiating plate and the wiring board to solder the wiring board, the electronic part and the heat radiating plate with the heat radiating plate pressurized against the wiring board in the heating portion; and
   (d) mounting the semiconductor pellet on the heat radiating plate after connecting the heat radiating plate,
   wherein the semiconductor pellet provided with a field effect transistor is mounted on the wiring board to assemble a high frequency module.

The above-mentioned and other objects and novel features of the present invention will be apparent from the description in this specification and the accompanying drawings.

BRIEF DESCRIPTIONS OF THE DRAWINGS

Figure 3:
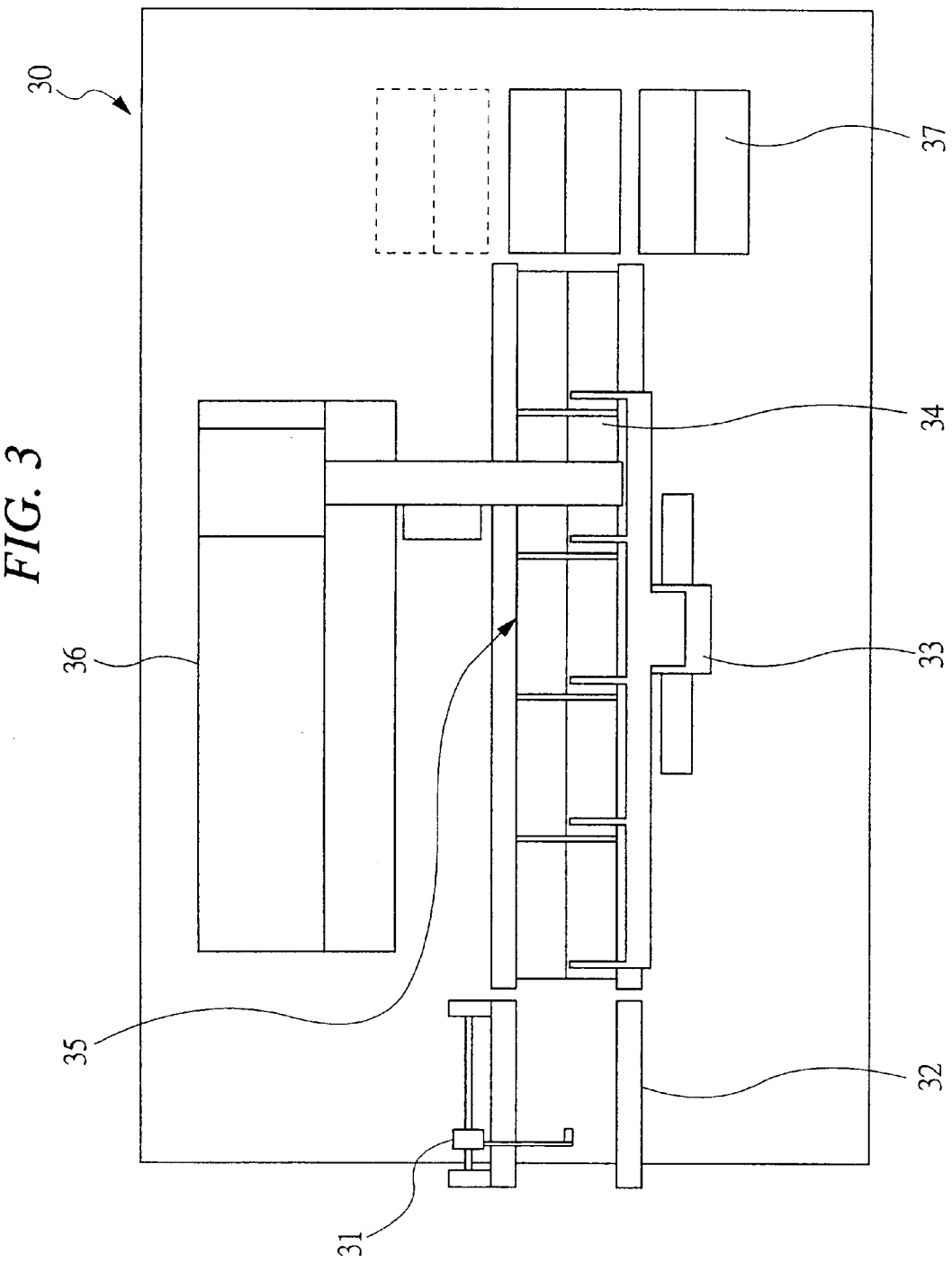
FIG. 3 is a conceptual view showing an embodiment of a structure of a reflow device to be used at a reflow step in the method of manufacturing a semiconductor integrated circuit device according to the present invention.
Figure 4:
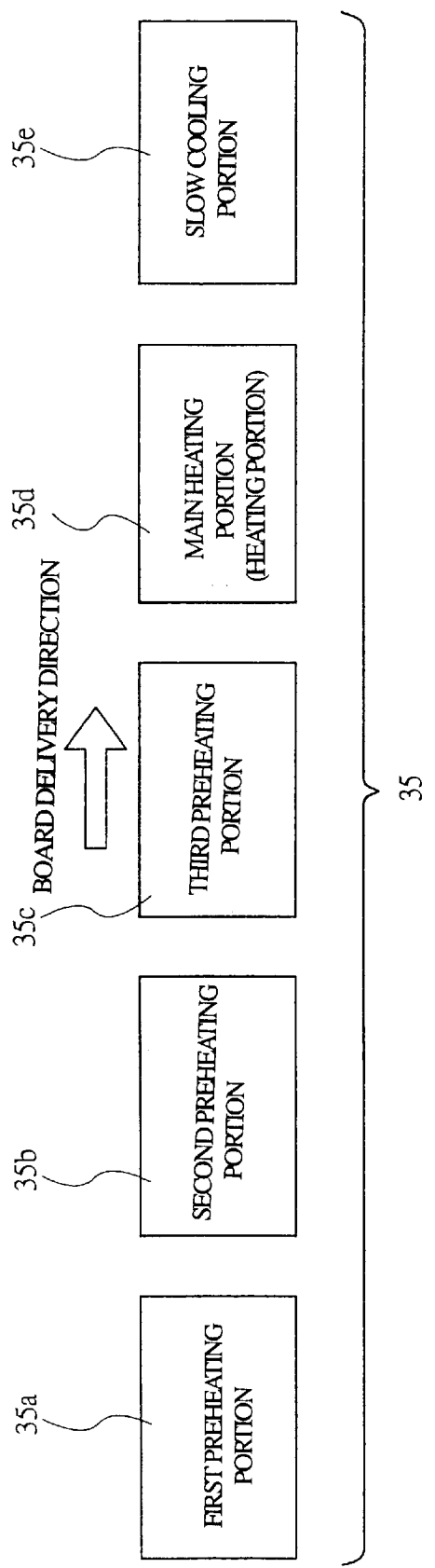
Figure 5:
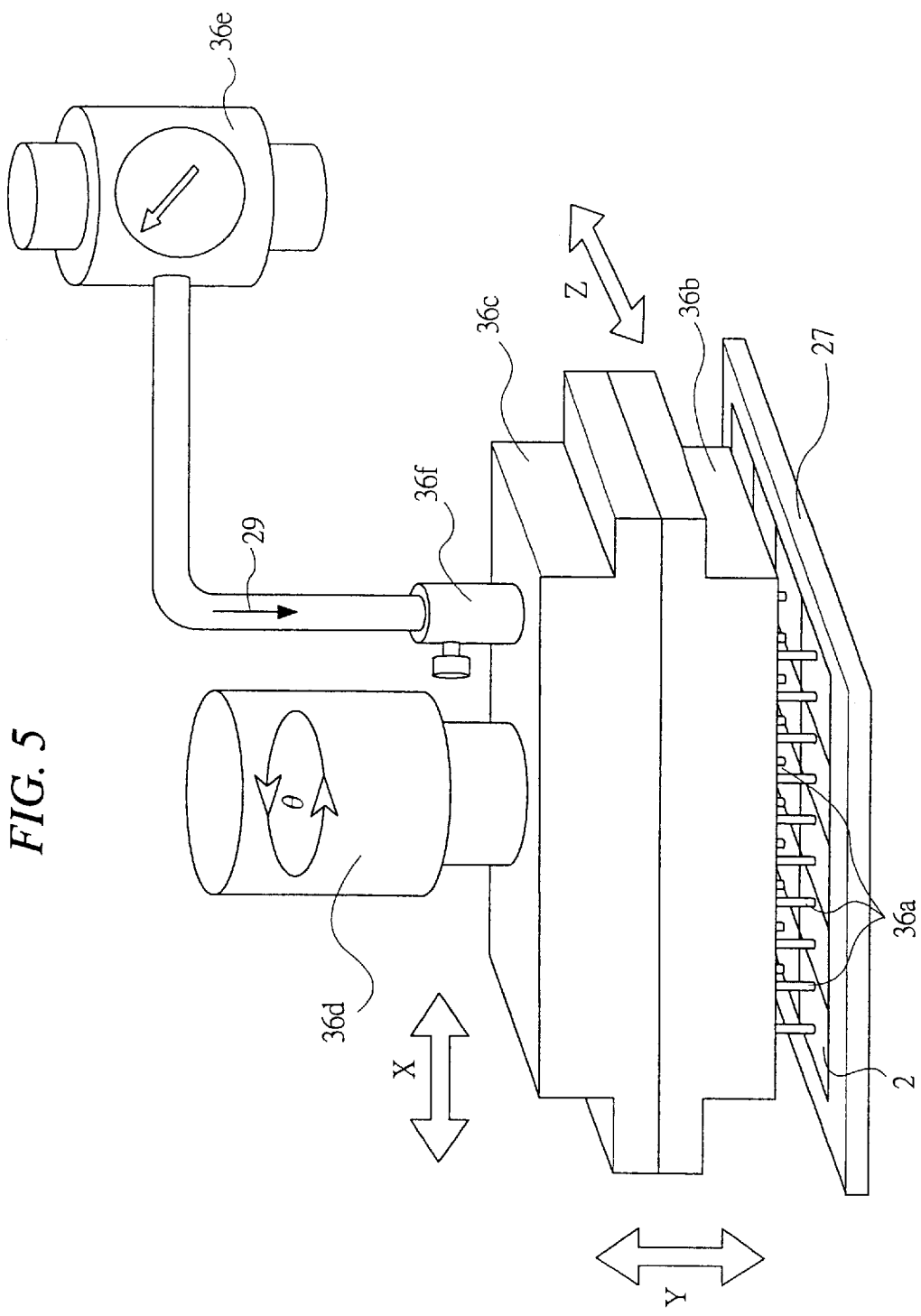
Figure 6B:
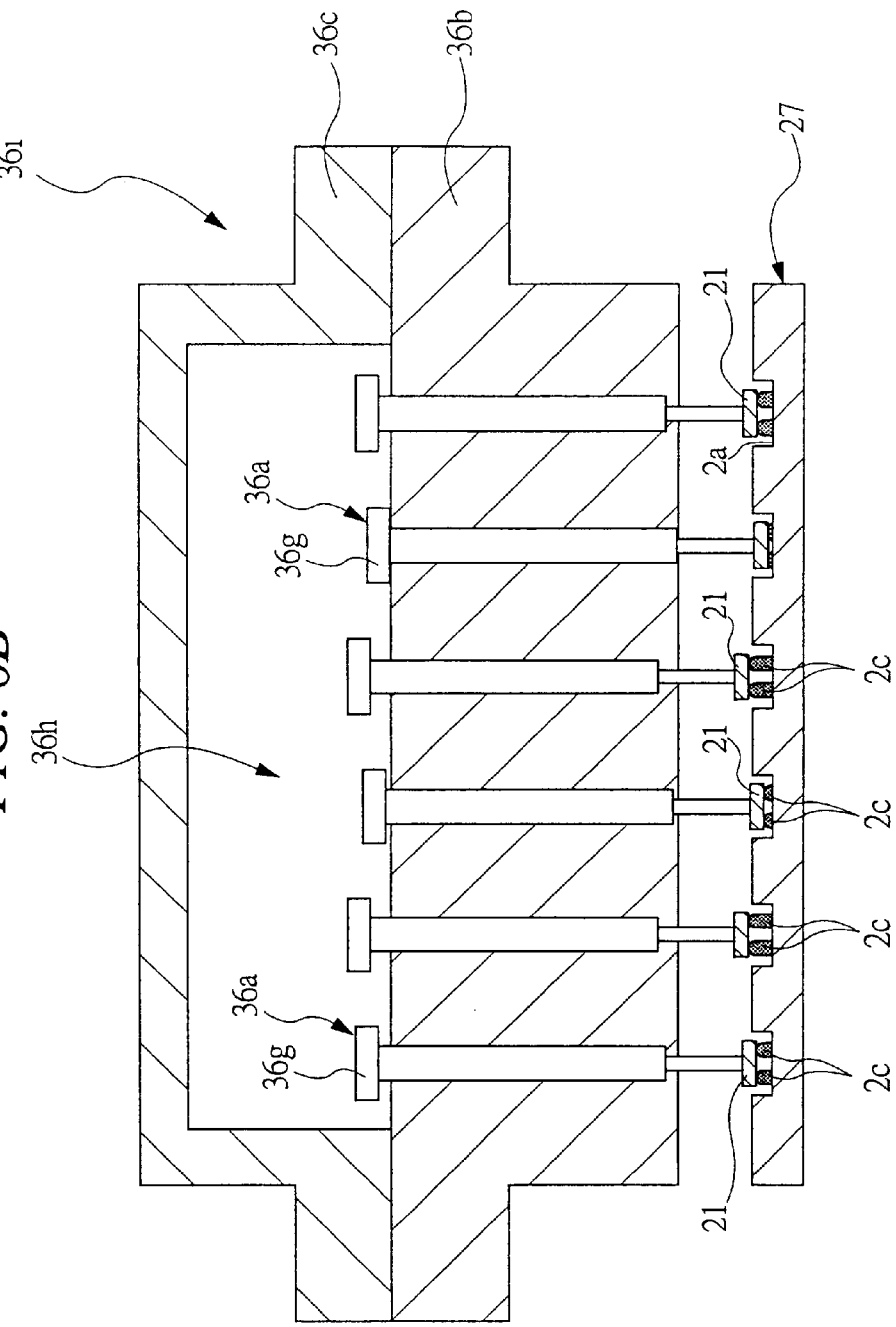
Figure 6A:
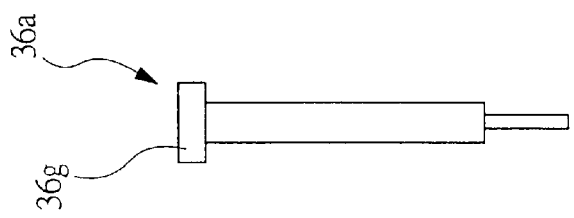
Figure 7A:
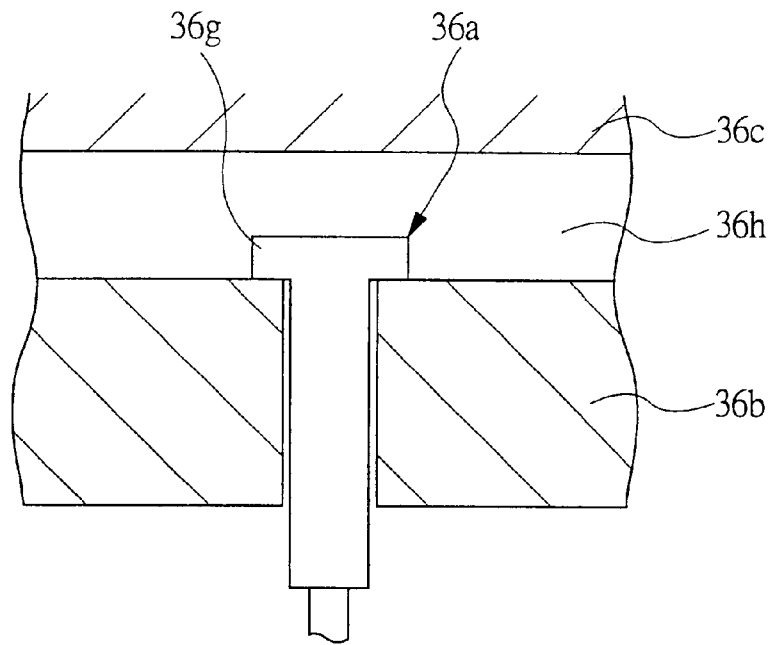
Figure 7B:
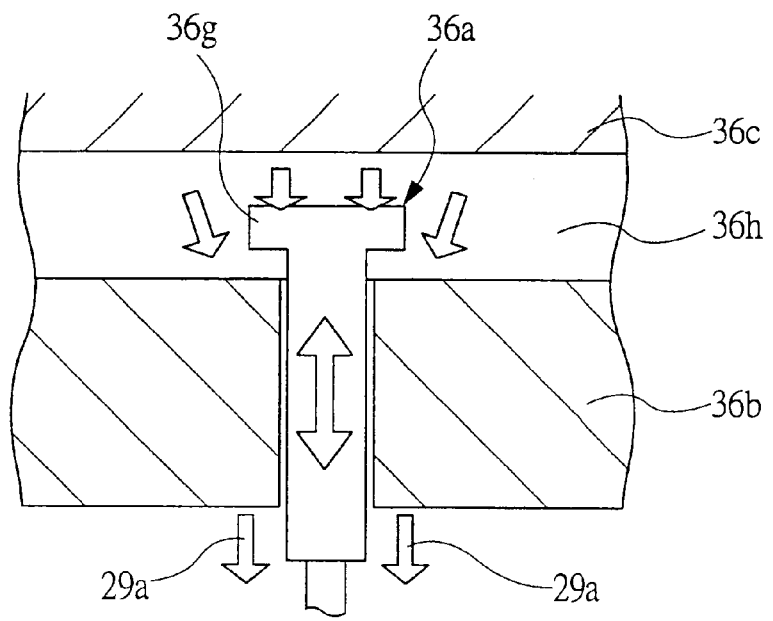
Figure 8:
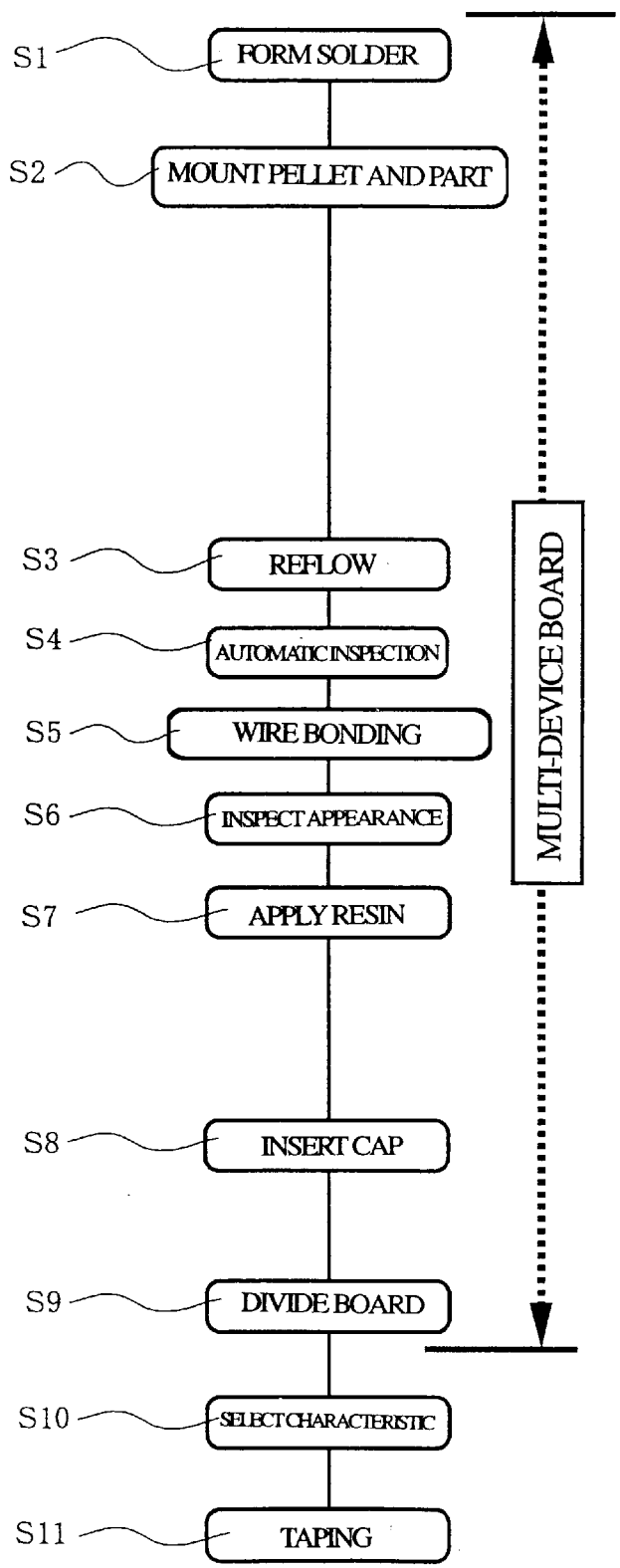
Figure 9A:
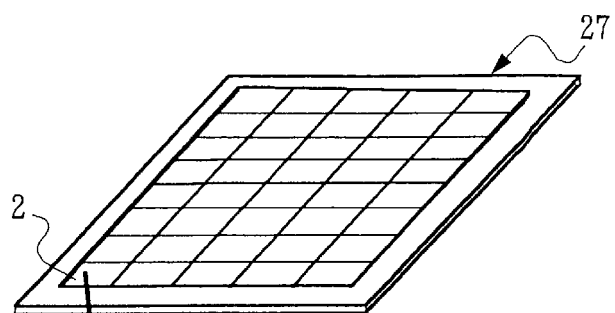
Figure 9B:
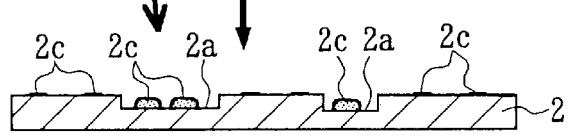
Figure 9C:
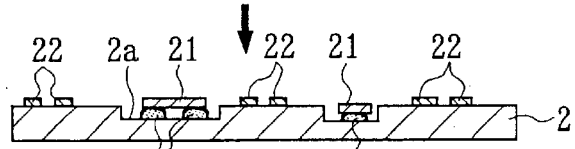
Figure 9D:
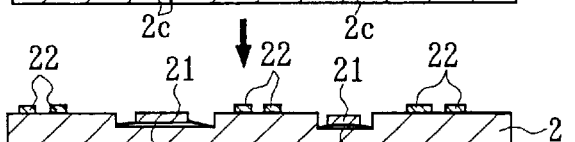
Figure 9E:
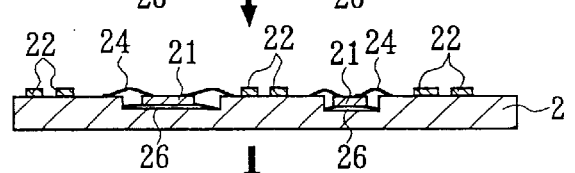
Figure 9F:
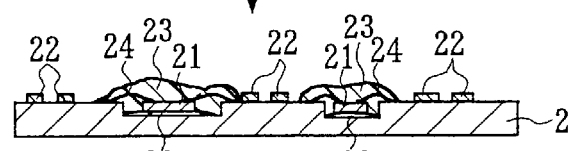
Figure 9G:
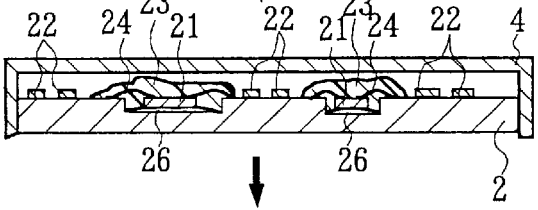
Figure 9H:
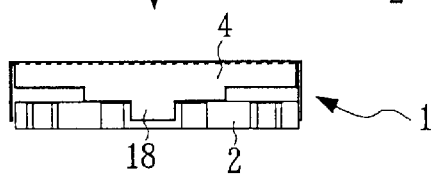
Figure 9I:
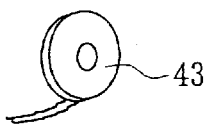
Figure 10A:
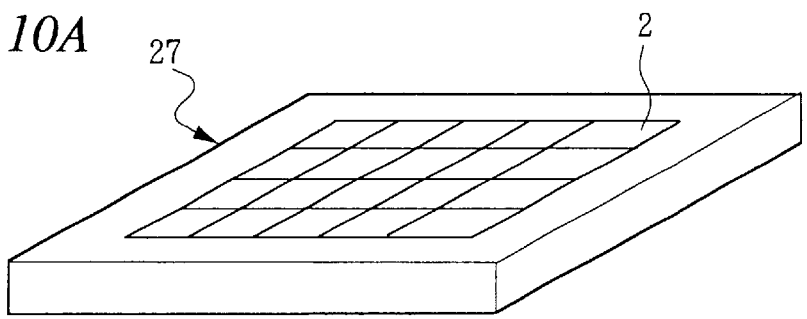
Figure 10B:
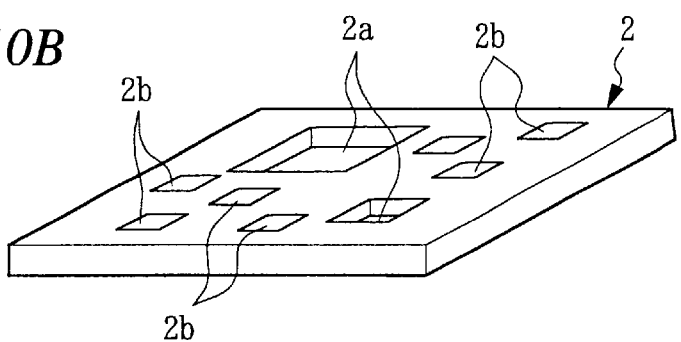
Figure 10C:
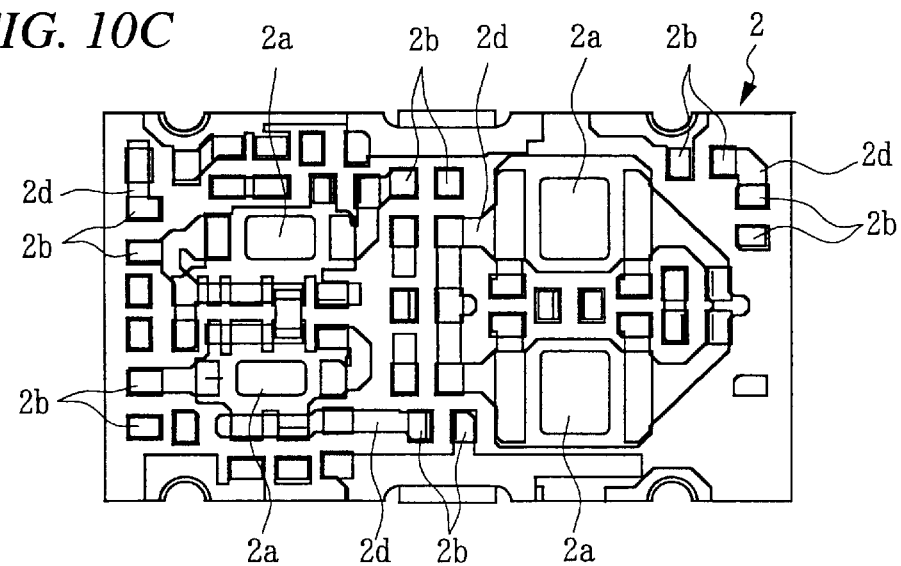
Figure 10D:
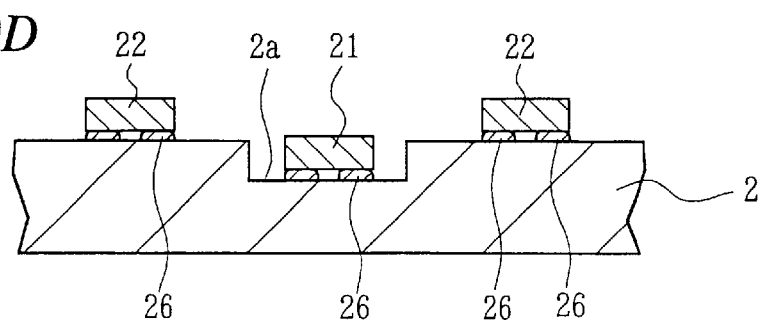
Figure 11A:
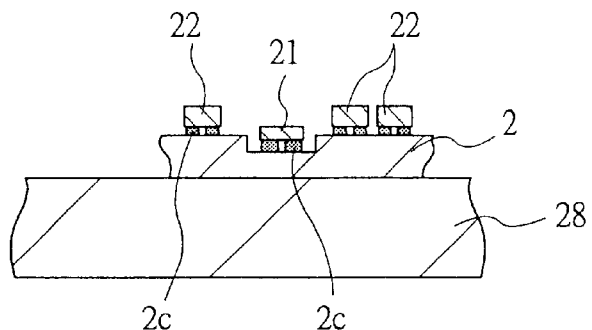
Figure 11B:
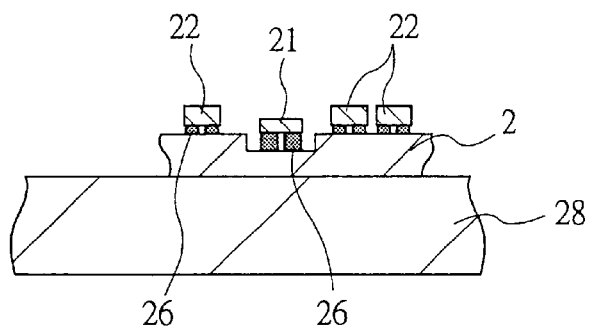
Figure 11C:
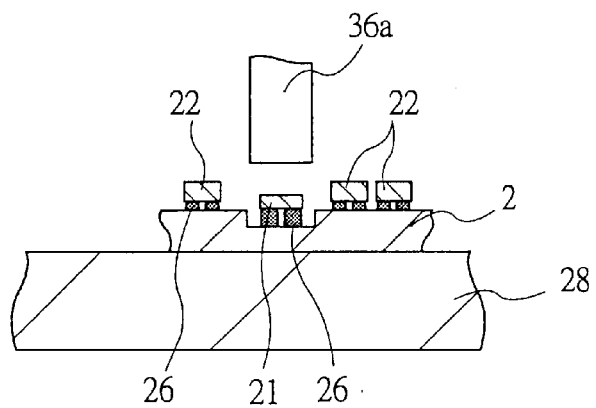
Figure 11D:
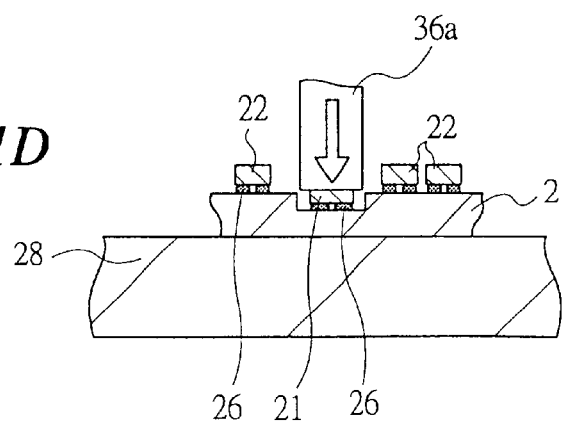
Figure 12A:
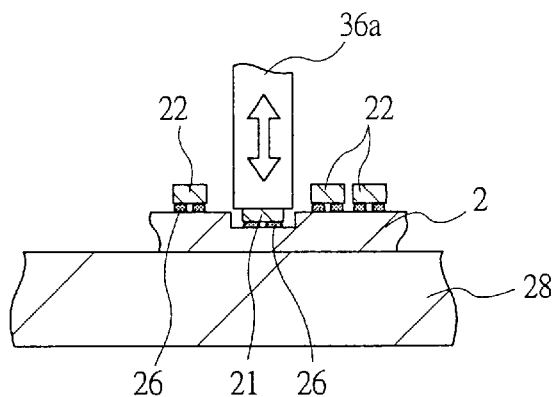
Figure 12B:
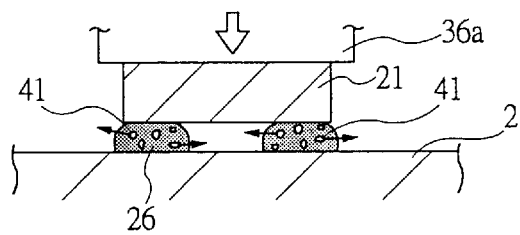
Figure 12C:
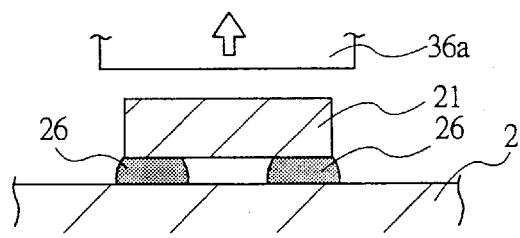
Figure 12D:
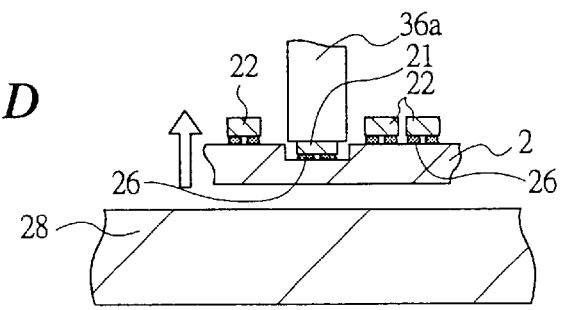
Figure 12E:
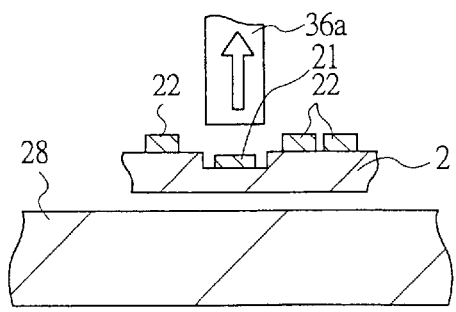
Figure 13:
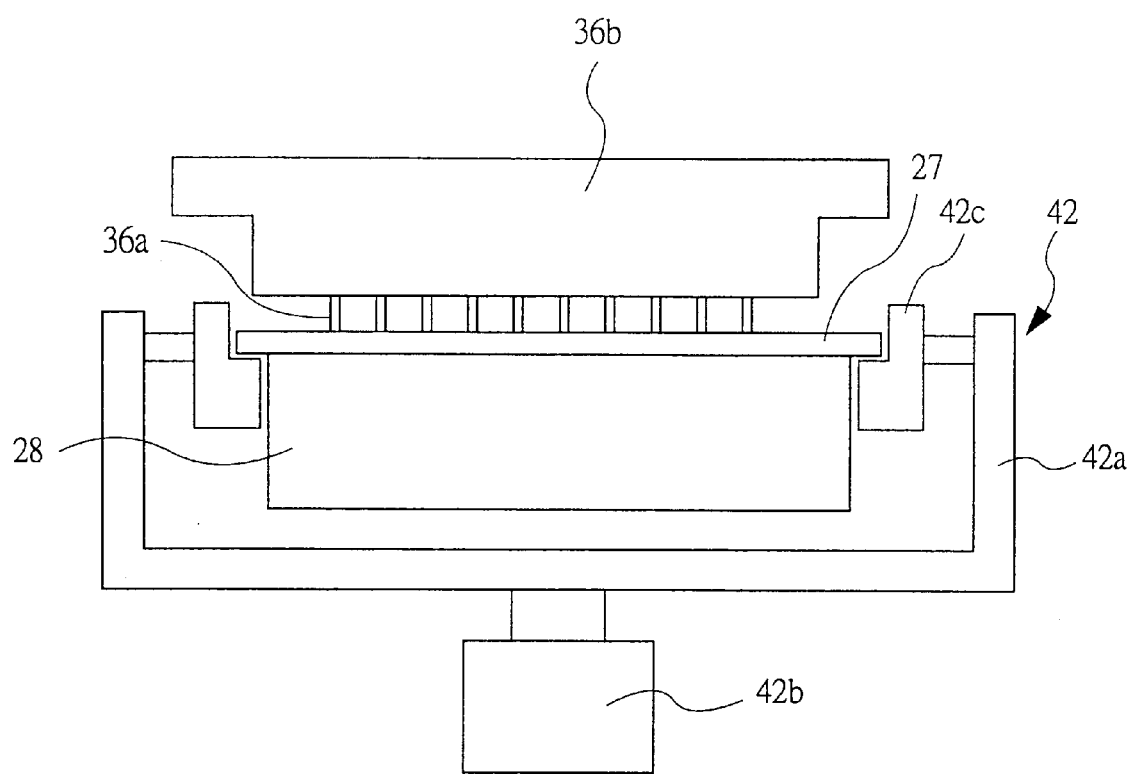
Figure 14:
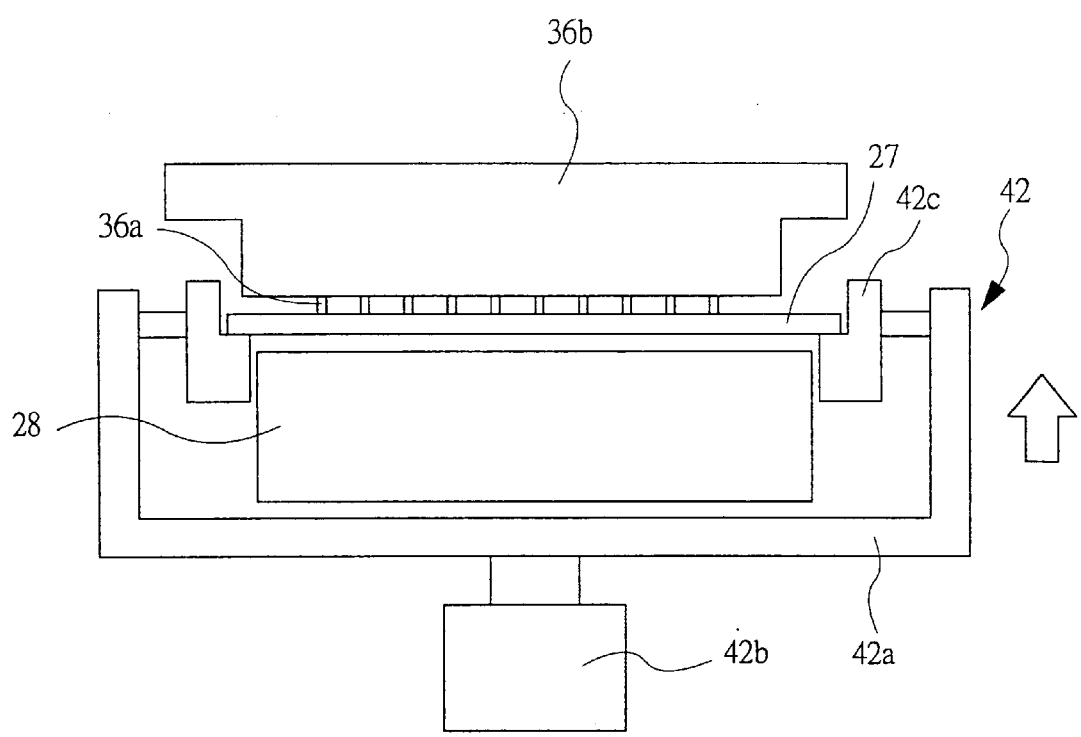
Figure 15:
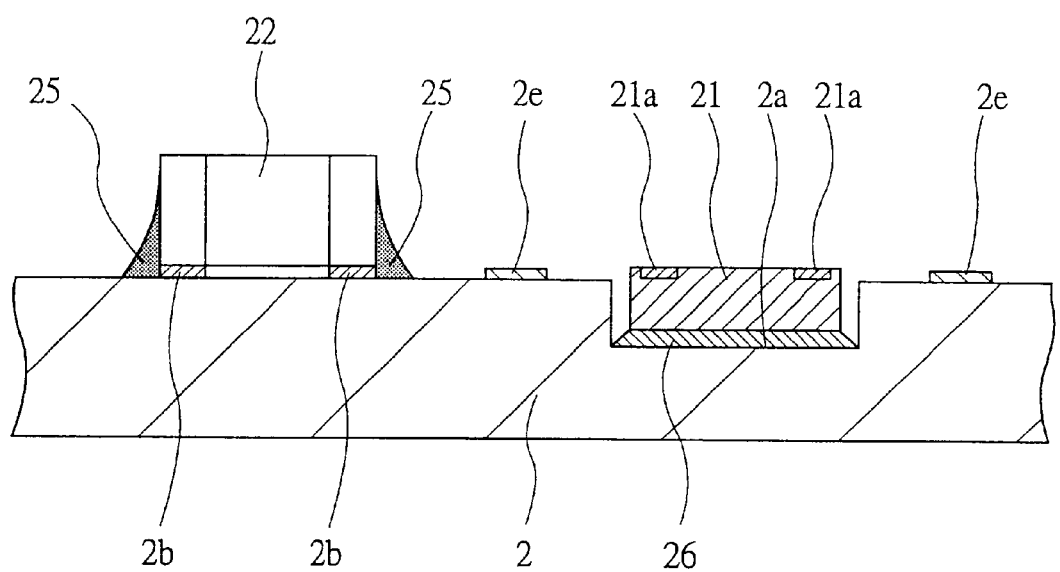
Figure 16A:
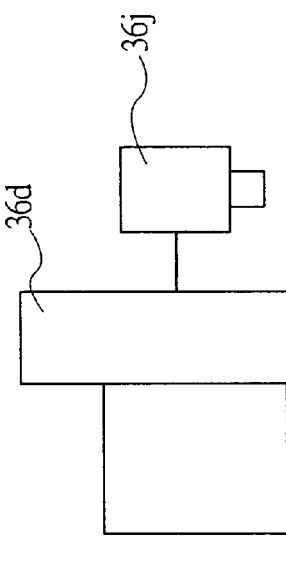
Figure 16B:
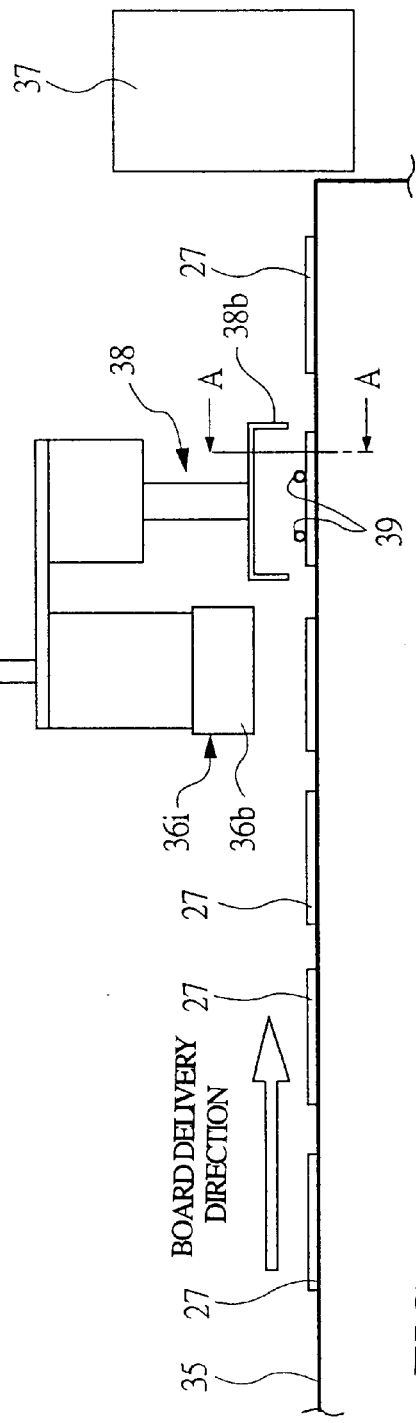
Figure 17:
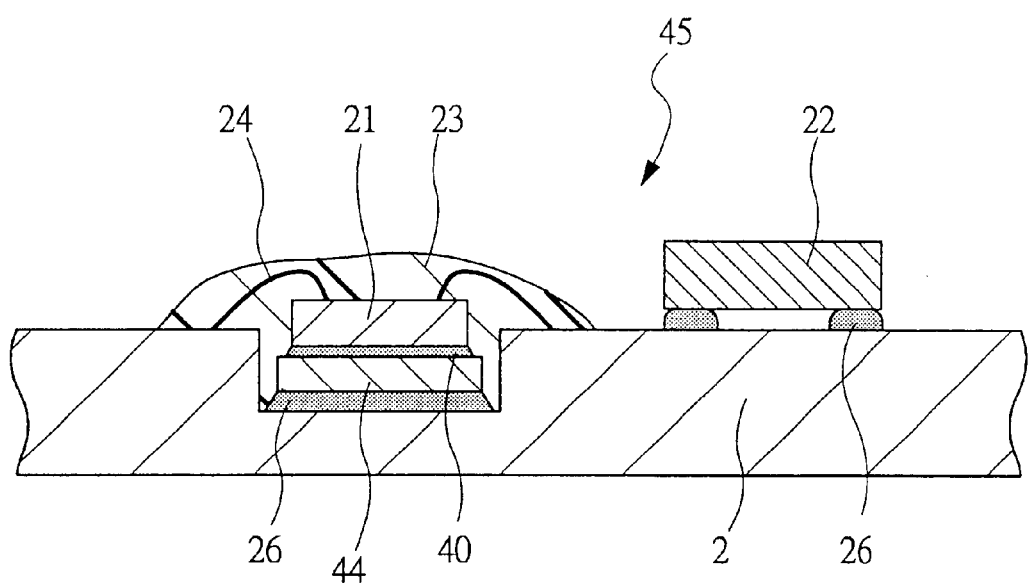

FIG. 4 a block diagram showing an example of a structure of a heat block portion in the reflow device illustrated in FIG. 3;

FIG. 5 is a perspective view showing an example of a structure of a pressurizing mechanism in the reflow device illustrated in FIG. 3;

FIGS. 6A and 6B are views showing an example of a structure of a frog jig in the pressurizing mechanism illustrated in FIG. 5, FIG. 6A being a side view showing a pusher pin and FIG. 6B being a sectional view showing the frog jig;

FIGS. 7A and 7B show an enlarged partial sectional view showing an example of a support structure of the pusher pin and an air blow-out state in the frog jig illustrated in FIG. 6, FIG. 7A showing regulation of flow of air through a flow regulator for a pusher pin supported on a pin block, and FIG. 7B showing regulation of a blow-out amount of air flowing out from a clearance between the pin block and the pusher pin;

FIG. 8 is a manufacturing process flow chart showing an example of an assembly procedure in a method of manufacturing a high frequency module illustrated in FIG. 1;

FIGS. 9A to 9I sectional, side and perspective views showing an example of structures of a printed circuit board and a high frequency module corresponding to a main step in FIG. 8; FIG. 9A being a perspective view showing a multi-device board, FIG. 9B showing of a step of forming a solder for reflow on a concave portion and an electrode in a wiring board, FIG. 9C showing a step of respectively mounting a pellet and chip part in a concave portion and in an electrode, FIG. 9D showing a step of solder connection for the semiconductor pellet and the chip part by heating the multi-device board to melt the solder formed on each wiring board, FIG. 9E showing a step of connecting a bonding pad and a board side terminal through a wire to carry out the wire bonding, FIG. 9F showing a step of dropping a sealing resin 23 onto the concave portion by a potting method to seal the semiconductor pellet and the wire, FIG. 9G showing a step of attaching a cap to the wiring board, FIG. 9H showing a step of dividing the multi-device board into individual wiring boards, and FIG. 9I showing a reel for accommodating a plurality of selected high frequency modules with taping and wound thereonto;

FIGS. 10A to 10D are views showing an example of structures of a board to be used for manufacturing the high frequency module illustrated in FIG. 1 and a state in which parts thereof are mounted, FIG. 10A being a perspective view showing a large number of mounting boards, FIG. 10B being a perspective view showing a printed circuit board, FIG. 10C being a plan view showing the printed circuit board, and FIG. 10D being a partial sectional view showing the part mounting state;

FIGS. 11A to 11D are partial sectional views showing an embodiment of a solder connecting method at the reflow step in the method of manufacturing a semiconductor integrated circuit device according to the present invention, FIG. 11A showing the state of a wiring board of a multi-device board and a heat block 28 from first preheating to third preheating, FIG. 11B showing the state of the heat block and the wiring board in a main heating portion, FIG. 11C showing a pusher pin supported on a pin block of a frog jig which is brought down through the axis robot arm, and FIG. 11D showing the pusher pin which comes in contact with a semiconductor pellet;

FIGS. 12A to 12E are partial sectional views showing an embodiment of the solder connecting method at the reflow step in the method of manufacturing a semiconductor integrated circuit board according to the present invention, FIG. 12A showing a pusher pin moved upwardly and downwardly to repeat the pressurization and separation of the pusher pin against and from a semiconductor pellet, FIG. 12B showing the semiconductor pellet pressurized by the pusher pin to crush a solder connecting portion once, FIG. 12C showing a frog jig lifted by a 4-axis robot arm to separate the pusher pin from the semiconductor pellet, FIG. 12D showing the wiring board separated from a heat block to cool the soldering portion with the pusher pin pushing the semiconductor pellet, and FIG. 12E showing the pusher pin lifted and separated from the semiconductor pellet by lifting the frog jig 36i through the 4-axis robot arm after the soldering is completed;

FIG. 13 is a conceptual view showing an example of a state in which a semiconductor pellet is pressurized at the reflow step in the method of manufacturing a semiconductor integrated circuit device according to the present invention;

FIG. 14 is a conceptual view showing an example of a cooling state after the pressurization of the semiconductor pellet at the reflow step in the method of manufacturing a semiconductor integrated circuit device according to the present invention;

FIG. 15 is an enlarged partial sectional view showing an example of the part mounting state after the reflow step in the method of manufacturing a semiconductor integrated circuit device according to the present invention; and FIGS. 16A and 16B are views showing an example of a soldering foreign sucking state at the reflow step in the method of manufacturing a semiconductor integrated circuit device according to the present invention, FIG. 16A being a structural conceptual view and FIG. 16B being a partial sectional view taken along the line A—A in FIG. 16A; and FIG. 17 a partial sectional view showing another embodiment of a structure of a high frequency module which is assembled by a method of manufacturing a semiconductor integrated circuit device according to the present invention.

DESCRIPTION OF THE PREFERRED EMBODIMENTS

An embodiment of the present invention will be described below in detail with reference to the drawings.

In the following embodiment, the same or similar portions will not be repetitively described in principle if they are not particularly necessary.

For convenience, a plurality of inventions will be described below in a series of embodiments, and it is apparent that each step is not indispensable for all the inventions except for the particular cases.

Furthermore, if necessary for convenience in the following embodiment, description will be given through a division into a plurality of sections or embodiments. Except for the particular cases, the sections or embodiments are related to each other and one of them has a relation to variants, details, supplemental description and the like for a part of all of the other.

In the following embodiment, the number of elements or the like (including the number, a numeric value, a quantity, a range and the like) is not restricted to a specific number except for the particularly explicit case and the case in which a specific number is apparently restricted in principle, and the specific number or more/less may be applied.

In the following embodiment, furthermore, it is apparent that components (including an element step and the like) are not indispensable except for the particularly explicit case and the case in which the components are indispensable in principle.

In the following embodiment, similarly, when the shape of the component or the like, a positional relationship and the like are to be described, substantially approximate or similar shapes and the like are included except for the particularly explicit case and the apparently different case in principle. This is also applicable to the numeric value and the range.

In all drawings for illustrating the embodiment, the same reference numerals denote members having the same functions and repetitive description will be omitted.

Figure 1A:
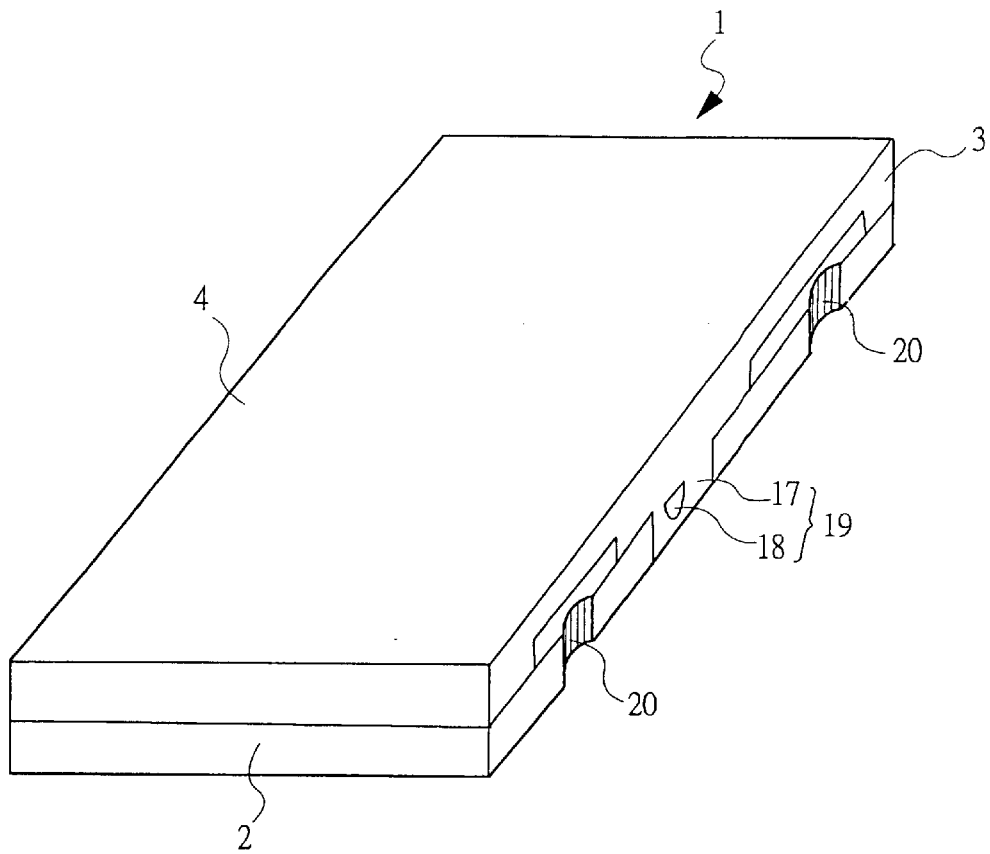
FIG. 1A is a perspective view showing an embodiment of a structure of a high frequency module which is assembled by a method of manufacturing a semiconductor integrated circuit device according to the present invention and FIG. 1B is a sectional view of the high frequency module in FIG. 1A.
Figure 1B:
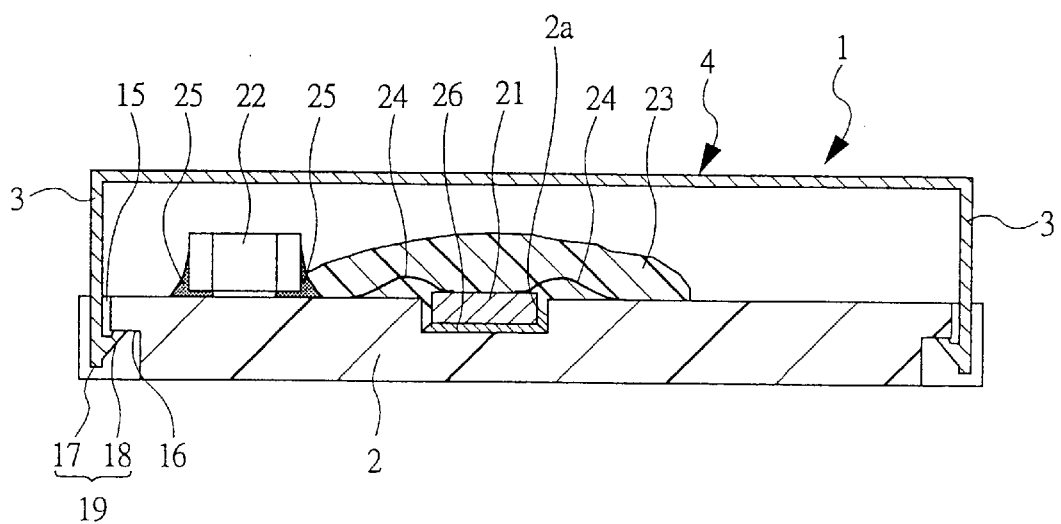
Figure 2:
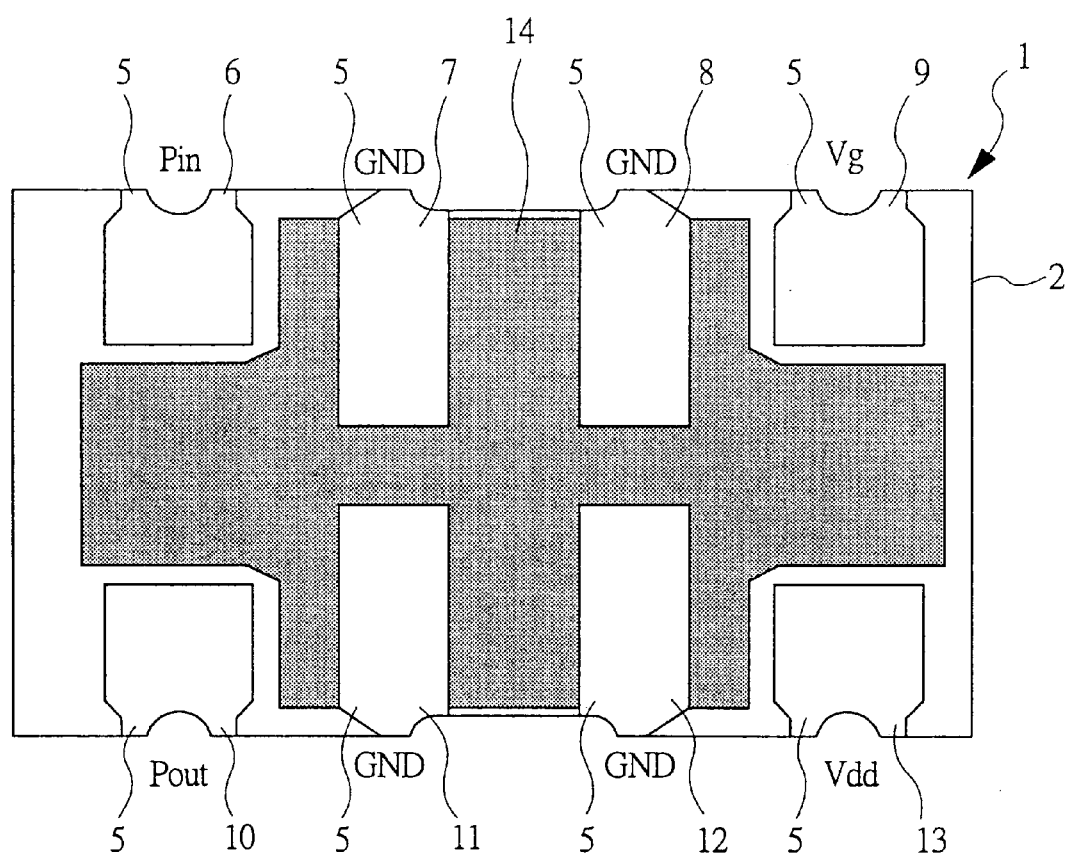
FIG. 2 is a bottom view showing the structure of the high frequency module illustrated in FIG. 1.

A semiconductor integrated circuit device to be assembled by the method of manufacturing the semiconductor integrated circuit device according to the present embodiment shown in FIGS. 1 and 2 is a high frequency power amplifier referred to as a high frequency module 1 (which is also referred to as a high frequency power module) and has a flat rectangular structure on an appearance basis in which a cap 4 is superposed on a main surface (a top surface) of a plate-shaped wiring board 2.

Accordingly, a semiconductor pellet 21 (an integrated circuit pellet) to be an active part which is mainly incorporated in a small-sized portable electronic device such as a mobile telephone, is provided with a field effect transistor and is mounted on a bare chip and a chip part 22 to be an electronic part (a surface mounted part or a surface assembled part) such as a surface mounting type chip capacitor or a chip resistor and a passive part are mounted (mixed) on the wiring board 2.

The high frequency module 1 has an outer peripheral edge of the cap 4 coincident with that of the wiring board 2 or positioned on the inside thereof as shown in FIG. 1A, and furthermore, the cap 4 is obtained by throttling a metal plate like a rectangular box and has a peripheral wall 3 protruded along a peripheral edge of a lower surface.

As shown in FIG. 1B, moreover, the cap 4 is provided with a hook support arm 17 protruded downward from the peripheral wall 3 in the center on both sides thereof, and furthermore, a hook click 18 formed by molding and protruded is provided on the inside of the tip side of the hook support arm 17. The hook click 18 and the hook support arm 17 form a hook 19 to be an engagement portion having an elastic force.

The cap 4 has a thickness of approximately 0.1 mm, for example, and is formed of platingless white metal (an alloy of nickel, copper and zinc), phosphor bronze subjected to nickel plating or the like. Consequently, wettability with a solder is enhanced.

Moreover, a dent 15 where the hook support arm 17 is to be provided is formed in the central parts on both sides of the wiring board 2. An engaging portion which is further concaved by one step is formed on the bottom of the dent 15, and the hook click 18 of the hook 19 is engaged with the engaging portion 16.

Since the dent 15 is formed, the hook support arm 17 is not protruded to the outside of the dent 15 with the hook click 18 engaged with the engaging portion 16.

Moreover, the hook support arm 17 is formed of a metal plate. Therefore, elastic force can act on the hook 19. Accordingly, the tip of the peripheral wall 3 of the cap 4 comes in contact with a main surface of the wiring board 2 and the hook click 18 is engaged with a back face of the wiring board 2 by the elastic force. Consequently, the cap 4 can be reliably fixed to the wiring board 2.

In that case, the hook 19 gives the elastic force to the wiring board 2. Therefore, the cap 4 can also be removed easily.

The engaging portion of the wiring board 2 with the cap 4 may have another structure.

As shown in FIG. 2, moreover, the back face of the wiring board 2 is provided with a plurality of external terminals 5. The external terminals 5 are provided at almost regular intervals on both sides in a longitudinal direction on the back face of the wiring board 2. One of lines (an upper line shown in FIG. 2) is provided with an input terminal (Pin) 6, a ground terminal (GND) 7, a ground terminal (GND) 8 and a gate bias terminal (Vg) 9 from left to right, and the other line (a lower line shown in FIG. 2) is provided with an output terminal (Pout) 10, a ground (GND) terminal 11, a ground (GND) terminal 12 and a power terminal (Vdd) 13 from left to right.

Furthermore, a side surface of the wiring board 2 corresponding to the input terminal 6, the gate bias terminal 9, the output terminal 10 and the power terminal 13 is provided with an end face through hole 20 in a portion reaching from a surface of the wiring board 2 to a back face thereof as shown in FIG. 1A. When the high frequency module 1 is to be mounted on a mounting board such as a printed circuit board, the mounting is carried out through connection with an electrode portion on the back face of the wiring board 2 and the end face through hole 20 portion on the side surface. Consequently, the high frequency module 1 can be mounted reliably.

A region extended to partition the flour ground terminals 7, 8, 11 and 12 on the back face of the wiring board 2 is provided with a resist film 14 formed of a material which is not wet to a mounting joining material (for example, a solder) which is used for mounting the high frequency module 1.

In the high frequency module 1, moreover, the chip part 22 is mounted on a surface of the wiring board 2 and the semiconductor pellet 21 is mounted through a solder connecting portion 26 on a concave portion 2a to be a cavity portion formed on the surface of the wiring board 2 as shown in FIG. 1B.

Furthermore, the chip part 22 is provided with a solder fillet 25 and is soldering connected to an electrode 2b (terminal) for a chip part of the wiring board 2 shown in FIG. 10B. ON the other hand, the semiconductor pellet 21 has a bonding pad 21a to be a surface electrode thereof (see FIG. 13) connected with a board side terminal 2e of the wiring board 2 through a wire 24 such as a metal wire.

The semiconductor pellet 21 and the wire 24 are resin sealed with a sealing resin 23 such as an epoxy resin.

Moreover, the high frequency module 1 has a width of 8 mm, a length of 12.3 mm and a height of 1.8 mm, for example.

Next, the structure of a reflow device to be used at a reflow step in the method of manufacturing a semiconductor integrated circuit device (high frequency module 1) according to the present embodiment will be described with reference to FIGS. 3 to 7.

A reflow device 30 shown in FIG. 3 serves to solder, through batch reflow, a multi-device board 27 shown in FIG. 5 which has the wiring board 2 provided with the chip part 22 and the semiconductor pellet 21 shown in FIG. 1B, and serves to press only the semiconductor pellet 21 to carry out solder melding heating and to then carry out cooling with the semiconductor pellet 21 maintained to be pressed intermittently or for a predetermined time.

Furthermore, when the semiconductor pellet 21 is to be pressurized, the pressurization is carried out with a frog-shaped pusher pin 36a having an independent suspending structure to be a pin member shown in FIG. 6A (a load is applied).

Moreover, the reflow device 30 can collectively assemble a plurality of high frequency modules 1 by using the multi-device board 27 provided with a plurality of wiring boards 2 shown in FIG. 10.

As shown in FIG. 3, the reflow device 30 is constituted a board feeing portion 31 for feeding the multi-device board 27, a joint conveyer portion 32 for sending the multi-device board 27 fed from the board feeding portion 31 to a board delivery system 42 shown in FIG. 13, a board forward feeding portion 33 for forward feeding the multi-device board 27 in the board delivery system 42, a heat block portion 35 for gradually heating the multi-device board 27, a board positioning portion 34 for positioning the multi-device board 27 in the heat block portion 35, a pellet contact portion 36 for pressurizing the semiconductor pellet 21, and an unloader portion 37 for accommodating the multi-device board 27 after reflow.

Moreover, the heat block portion 35 includes five stations divided depending on a heating or cooling temperature, that is, a first preheating portion 35a, a second preheating portion 35b, a third preheating portion 35c, a main heating portion (heating portion) 35d and a slow cooling portion 35e. Each of the stations is provide with the heat block 28 shown in FIG. 13. Each heat block 28 can be set to various temperatures.

Consequently, preheating is carried out plural times so that the temperature of the multi-device board 27 can be prevented from being changed rapidly. For example, if the multi-device board 27 is a ceramic board, a board crack can be prevented.

Furthermore, a pellet contact portion 36 is provided with a pin block 36b for movably supporting a plurality of pusher pins 36a; a block 36c for air tension forming a pressure region 36h for the pusher pin 36a using an air 29 shown in FIG. 5; a 4-axis robot arm 36d for movably supporting a frog jig 36i including the block 36c for air tension and the pin block 36b in X, Y and X directions and θ rotation; an air regulator 36e for regulating a pressure to be applied to the pusher pin 36a through the air 29; and a flow regulator 36f for regulating a flow of the air 29 as shown in FIGS. 6A and 6B.

Since the 4-axis robot arm 36d supporting the frog jig 36i can be moved in the X, Y and Z direction and the θ rotation, the operation of the frog jig 36i can be set easily and freely.

Moreover, the pusher pin 36a shown in FIG. 6A is provided to be aligned with each of the mounted semiconductor pellet 21 corresponding to thereto with one to one, and a head portion 36g is formed like a flange.

Accordingly, the pin block 36b slidably support a plurality of pusher pins 36a like a frog with an independent suspending structure. Consequently, when the air 29 is supplied to the pressure region 36h of the block 36c for air tension, the air 29 pressurizes the head portion 36g of the pusher pin 36a so that the pusher pin 36a gives a pressure to the semiconductor pellet 21.

More specifically, the pressure of the pusher pin 36a to be applied to the semiconductor pellet 21 is controlled by the pressure of the air 29 supplied to the pressure region 36h of the block 36c for air tension and the flow thereof.

Accordingly, low-load control (approximately several grams) can easily be carried out on all the pusher pins 36a.

When the pusher pin 36a is protruded from the pin block 36b by a predetermined amount, the head portion 36g hits on an internal receiving surface of the pin block 36b and the pusher pin 36a is not protruded from the pin block 36b any longer.

Moreover, if a higher pressure than the pressure applied from the air 29 is given from the tip side of the pusher pin 36a, the pusher pin 36a can also be pushed up.

By regulating the flow of the air 29 through the flow regulator 36f shown in FIG. 5 for the pusher pin 36a supported on the pin block 36b as shown in FIG. 7A, a blow-out amount 29a of the air 29 flowing out from a clearance between the pin block 36b and the pusher pin 36a can also be regulated as shown in FIG. 7B.

Accordingly, the regulation of the blow-out amount 29a can prevent sliding from being hindered due to flux on the pusher pin 36a or the like. As a result, an overload can be prevented from being applied to the semiconductor pellet 21.

As shown in FIG. 13, moreover, the board delivery system 42 is provided with a delivery chute 42c for supporting the multi-device board 27; a delivery rail 42a having the delivery chute 42c attached thereto; and an elevating actuator 42b for supporting and elevating the delivery rail 42a. The board delivery system 42 can elevate the delivery chute 42c attached to the delivery rail 42a through the elevating actuator 42a independent of the heat block 28 as shown in FIG. 14.

Accordingly, when the multi-device board 27 is to be removed from the heat block 28, the delivery rail 42a is lifted by the elevating actuator 42b. As shown in FIG. 14, consequently, the multi-device board 27 can be removed from the heat block 28 with the pusher pin 36a pressing (pressurizing) the semiconductor pellet 21 as shown in FIG. 1B.

As shown in FIG. 16A, moreover, the 4-axis robot arm 36d is provided with a sucking unit 38 for sucking and removing a soldering foreign substance 39 such as a solder ball shown in FIG. 16B on the wiring board 2 (the multi-device board 27) which is scattered due to heating melting.

The sucking unit 38 comprises a sucking hood 38b for guiding an air flow 38c for sucking the soldering foreign substance 39 and a sucking portion 38a for generating the air flow 38c to suck and remove the soldering foreign substance 39 from the wiring board 2.

Next, the method of manufacturing a semiconductor integrated circuit device (the high frequency module 1) according to the present embodiment will be described with reference to a manufacturing process flow chart shown in FIG. 8.

In the method of manufacturing a semiconductor integrated circuit device, description will be given to the case in which a plurality of high frequency modules 1 are collectively assembled from one multi-device board 27 provided with a plurality of wiring boards as shown in FIG. 10.

First of all, the multi-device board 27 provided with a plurality of wiring boards 2 shown in FIGS. 9A and 10A are prepared. The multi-device board 27 is a ceramic board, for example, and has a size of approximately 78.75 mm×75.00 mm when 40 wiring boards 2 are formed as an example. The multi-device board 27 may be a glass epoxy based board other than the ceramic board.

The wiring board 2 is a multilayered wiring board, for example. The surface of each of the wiring boards 2 is provided with one or more concave portions 2a and an electrode (terminal) 2b for a chip part as shown in FIG. 10B corresponding to the numbers of the semiconductor pellet 21 for mounting a bare chip and the chip parts 22. The electrode 2b for a chip part is connected through various surface wirings 2d as shown in FIG. 10C.

As shown in FIG. 10D, moreover, the semiconductor pellet 21 is mounted on the concave portion 2a, while the chip part 22 is mounted on the electrode 2b for a chip part shown in FIG. 10C on the surface of the wiring board 2.

Then, a solder is formed on the wiring board 2 shown in Step S1 in FIG. 8.

More specifically, a solder 2c for reflow to be a connecting solder is formed on the concave portion 2a and the electrode 2b for a chip part in the wiring board 2 through solder printing, potting or the like as shown in FIG. 9B.

Furthermore, the pellet and part mounting as shown in Step S2 is carried out and the semiconductor pellet 21 is provided in the concave portion 2a of the wiring board 2 of the multi-device board 27 and the chip part 22 is provided in the electrode 2b for a chip part on the surface of the wiring board 2 of the multi-device board 27 as shown in FIG. 9C.

Thereafter, the reflow shown in Step S3 is carried out.

More specifically, the multi-device board 27 is heated to melt the solder 2c for reflow which is formed on each wiring board 2. As shown in FIG. 9D, consequently, the solder connection for the semiconductor pellet 21 and the chip part 22 is carried out.

At the reflow step, first of all, the multi-device board 27 is fed from the board feeding portion 31 to the board delivery system 42 through the joint conveyer portion 32 in the reflow device 30 shown in FIG. 3.

Furthermore, the multi-device board 27 is delivered to the first preheating portion 35a shown in FIG. 4 through the board forward feeding portion 33 of the board delivery system 42 and is preheated therein. A set heating temperature of the first preheating portion 35a is 80° C., for example, and a time required for passage of one multi-device board 27 is 60 seconds, for example.

Then, the multi-device board 27 is caused to sequentially pass through the second preheating portion 35b (for example, a set heating temperature of 130° C., a passage time of 60 seconds) and the third preheating portion 35c (for example, a set heating temperature of 215° C., a passage time of 60 seconds), and is gradually heated.

FIG. 11A shows the state of the wiring board 2 of the multi-device board 27 and the heat block 28 from the first preheating to the third preheating.

Subsequently, the multi-device board 27 is fed to the main heating portion 35d (for example, a set heating temperature of 325° C., a passage time of 60 seconds) and the reflow is carried out therein.

More specifically, both the chip part 22 and the semiconductor pellet 21 are subjected to batch reflow in the main heating portion 35d. FIG. 11B shows the state of the heat block 28 and the wiring board 2 in the main heating portion 35d.

In the main heating portion 35d, first of all, an image of the multi-device board 27 is fetched through a camera 36j for a position correction shown in FIG. 16A which is attached to the 4-axis robot arm 36d when the multi-device board 27 is to be positioned. Thus, the position of the multi-device board 27 is corrected automatically.

Subsequently, the frog jig 36i is positioned by the 4-axis robot arm 36d, and each semiconductor pellet 21 and the pusher pin 36a corresponding thereto are positioned.

Then, while the semiconductor pellet 21 is pressurized for the wiring board 2 of the multi-device board 27, the solder connecting portion 26 is heated and molten through the batch reflow and the amount of pressurization against the semiconductor pellet 21 is changed during the heating and melting.

In that case, first of all, the pressure of the air 29 applied to the pusher pin 36a is regulated in a predetermined amount through the air regulator 36e and the flow regulator 36f. In this state, the pusher pin 36a supported on the pin block 36b of the frog jig 36i is brought down through the 4-axis robot arm 36d shown in FIG. 5 as shown in FIG. 11C and the pusher pin 36a comes in contact with the semiconductor pellet 21 and the descent of the frog jig 36i is stopped when a predetermined pressure is applied from the pusher pin 36a to the semiconductor pellet 21 as shown in FIG. 11D.

As shown in FIG. 12A, subsequently, the pusher pin 36a is moved upwardly and downwardly and the pressurization and separation of the pusher pin 36a against and from the semiconductor pellet 21 are repeated. Consequently, the amount of pressurization of the pusher pin 36a against the semiconductor pellet 21 during the heating and melting is changed.

In the present embodiment, the pusher pin 36a is pressurized or is not pressurized against the semiconductor pellet 21 repeatedly as the change in pressurization. In that case, for example, after the operations for pressurization and separation of the pusher pin 36a are carried out twice respectively, a third pressurizing operation is finally performed to achieve the separation.

More specifically, after the semiconductor pellet 21 is pressurized by the pusher pin 36a to crush the solder connecting portion 26 once as shown in FIG. 12B, the frog jig 36i is lifted by the 4-axis robot arm 36d to separate the pusher pin 36a from the semiconductor pellet 21 as shown in FIG. 12C.

Then, the frog jig 36i is brought down through the 4-robot arm 36d again to pressurize the semiconductor pellet 21 through the pusher pin 36a as shown in FIG. 12B. Consequently, the solder connecting portion 26 is crushed again.

Thereafter, the frog jig 36i is lifted through the 4-axis robot arm 36d again to separate the pusher pin 36a from the semiconductor pellet 21.

Subsequently, the frog jig 36i is brought down through the 4-axis robot arm 36d again to pressurize the semiconductor pellet 21 through the pusher pin 36a. Consequently, the solder connecting portion 26 is crushed again.

As shown in FIG. 12B, consequently, a void 41 can be removed from the solder connecting portion 26 of the semiconductor pellet 21 and the wiring board 2.

The repetitive operation for pressurization and separation of the pusher pin 36a may be carried out any time. Moreover, the separation is not always required and the pusher pin 36a may be lifted slightly such that the pressurizing force of the semiconductor pellet 21 through the pusher pin 36a is reduced.

In the main heating portion 35d, then, the solder connecting portion 26 of the semiconductor pellet 21 and the wiring board 2 is cooled and the wiring board 2 and chip part 2 and the wiring board 2 and semiconductor pellet 21 are soldered with the semiconductor pellet 21 pressurized against the multi-device board 27.

When the soldering portion 26 is to be cooled, the wiring board 2 (the multi-device board 27) is separated from the heat block 28 provided in the main heating portion 35d to reduce (cool) the temperature of the soldering portion 26.

In the main heating portion 35d, the delivery rail 42a is lifted by the elevating actuator 42b as shown in FIG. 14. As a result, the wiring board 2 of the multi-device board 27 is separated from the heat block 28 to cool the soldering portion 26 with the pusher pin 36a pushing (pressurizing) the semiconductor pellet 21 as shown in FIG. 12D.

Then, the frog jig 36i is lifted through the 4-axis robot arm 36d after the soldering is completed. As shown in FIG. 12E, consequently, the pusher pin 36a is lifted and is separated from the semiconductor pellet 21.

According to the present embodiment, the soldering portion 26 is cooled with the semiconductor pellet 21 pressurized against the wiring board 2. Consequently, the semiconductor pellet 21 can be mounted horizontally on the wiring board 2. As a result, a degree of mounting horizontality of the semiconductor pellet 21 on the wiring board 2 can be enhanced.

As shown in FIG. 15, consequently, a bonding pad 21a of the semiconductor pellet 21 and a substrate side terminal 2e of the wiring board 2 are provided horizontally. Therefore, bonding precision can be enhanced during wire bonding. Accordingly, bonding failures can be reduced.

Figure 16B:
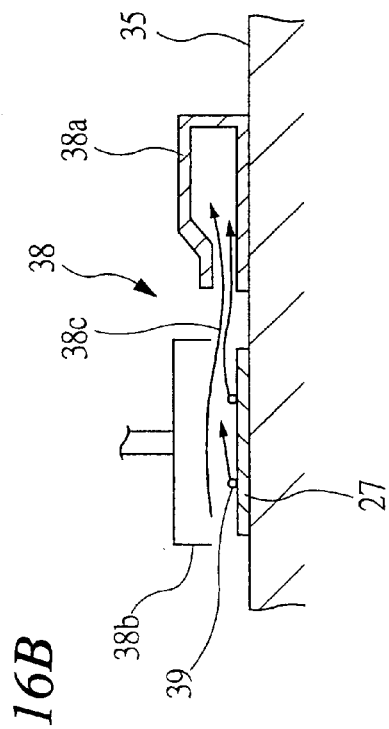

In the reflow device 30 according to the present embodiment, then, the soldering foreign substance 39 such as a solder ball which is scattered by the heading and melting is sucked and is removed from the wiring board 2 and the semiconductor pellet 21 mounted thereon in the main heating portion 35d as shown in FIG. 16.

More specifically, the sucking hood 38b is provided on the multi-device board 27 through the 4-axis robot arm 36d as shown in FIG. 16A, and furthermore, the soldering foreign substance 39 is sucked by the sucking portion 38a as shown in FIG. 16B. In that case, a passageway for the air flow 38c is formed by the sucking hood 38b. As a result, the soldering foreign substance 39 is sucked by the sucking portion 38a and is removed from the multi-device board 27.

Then, the multi-device board 27 is fed to the slow cooling portion 35e shown in FIG. 4 and is gradually cooled.

The temperature of the heat block 28 in the slow cooling portion 35e is 180° C., for example, and a passage time in the slow cooling portion 35e is approximately 60 seconds.

Consequently, the reflow step at the Step S3 shown in FIG. 8 is completed.

Then, an automatic inspection shown in Step S4 is carried out.

The appearance of the multi-device board 27 is inspected after the reflow and the presence of reflow failures is inspected.

Subsequently, wire bonding shown in Step S5 is carried out.

As shown in FIG. 9E, for example, the wire bonding is carried out by using the wire 24 such as a metal wire, and the bonding pad 21a to be the surface electrode of the semiconductor pellet 21 and the board side terminal 2e in the wiring board 2 of the multi-device board 27 corresponding thereto are connected through the wire 24.

Then, appearance inspection at Step S6 is carried out.

The appearance of the multi-device board 27 is inspected after the wire bonding and the presence of wire bonding failures is inspected.

Then, a resin (sealing resin) is applied at Step S7.

As shown in FIG. 9F, a sealing resin 23 is dropped onto the concave portion 2a shown in FIG. 9B in the wiring board 2 of the multi-device board 27 by a potting method. Consequently, the semiconductor pellet 21 and the wire 24 are sealed with the sealing resin 23.

Then, cap insertion shown in Step S8 is carried out and the cap 4 is attached to the wiring board 2 as shown in FIG. 9G.

Consequently, each wiring board 2 in the multi-device board 27 is covered with the cap 4.

Thereafter, board division shown in Step S9 is carried out to divide the multi-device board 27 into individual wiring boards 2. Thus, the configuration of individual high frequency modules 1 shown in FIG. 9H is obtained.

Subsequently, characteristic selection shown in Step S10 is carried out to acquire the electrical characteristic of each high frequency module 1. Based on the result, the high frequency module 1 is selected.

Then, taping shown in Step S11 is carried out.

More specifically, a plurality of high frequency modules thus selected are subjected to the taping, and are wound onto a reel 43 shown in FIG. 9I and is accommodated.

According to the method of manufacturing a semiconductor integrated circuit device (high frequency module 1) in accordance with the present embodiment, the following functions and effects can be obtained.

More specifically, at the reflow step to be carried out when the high frequency module 1 is assembled, the soldering portion 26 of the semiconductor pellet 21 and the wiring board 2 is cooled with the semiconductor pellet 21 capable of carrying out bare chip mounting pressurized against the wiring board 2 of the multi-device board 27. Consequently, the cooling can be carried out with the soldering portion 26 pressed.

Accordingly, the generation of the void 41 in the soldering portion 26 can be prevented. As a result, the connecting reliability of the soldering portion 26 can be enhanced.

Furthermore, the soldering portion 26 is cooled with the semiconductor pellet 21 pressurized against the wiring board 2. Consequently, the semiconductor pellet 21 can be mounted on the wiring board 2 horizontally. As a result, the degree of mounting horizontality on the wiring board 2 of the semiconductor pellet 21 can be enhanced.

As shown in FIG. 15, accordingly, the bonding pad 21a of the semiconductor pellet 21 and the board side terminal 2e of the wiring board 2 are provided horizontally. Therefore, the bonding precision can be enhanced during the wire bonding. As a result, the bonding failures can be reduced.

In the main heating portion 35d (heating portion), moreover, the soldering portion 26 is cooled with the semiconductor pellet 21 pressurized against the wiring board 2. Consequently, the soldering portion 26 can be cooled in the heating place. Thus, a cooling region can be decreased.

As a result, the size of the reflow device 30 can be reduced so that a space can be saved.

Moreover, the amount of pressurization of the semiconductor pellet 21 through the pusher pin 36a is changed during the heating and melting operation of the soldering portion 26 at the reflow step. Consequently, a pressure to be applied to the soldering portion 26 during the melting is varied. Thus, a kinetic energy can be given to air of the void 41 formed in the soldering portion 26.

As a result, the kinetic energy of the air in the void 41 is activated and the soldering portion 26 is pressurized. Consequently, the void 41 can be pushed out of the soldering portion 26.

Accordingly, the void 41 of the soldering portion 26 can be removed. As a result, the connecting reliability of the soldering portion 26 can be enhanced.

At the reflow step, moreover, the soldering foreign substance 39 scattered by the heating and melting operation of the soldering portion 26 is sucked by the sucking portion 38a. Consequently, the soldering foreign substance 39 can be removed from the wiring board 2 and the semiconductor pellet 21.

As a result, the soldering foreign substance 39 is removed from the wiring board 2 and the semiconductor pellet 21 during the wire bonding. Therefore, it is possible to prevent the bonding failures from being generated due to the soldering foreign substance 39.

At the reflow step, moreover, the surface mounting type chip part 22 and the semiconductor pellet 21 capable of carrying out the bare chip mounting are subjected to the batch reflow. Consequently, the number of times of application of a thermal stress on a product, that is, the high frequency module 1 can be decreased. As a result, the quality of the high frequency module 1 can be enhanced.

Furthermore, the chip part 22 and the semiconductor pellet 21 are subjected to the batch reflow so that a reflow processing can be shortened. As a result, the reflow step can be simplified.

Through the batch reflow of the chi part 22 and the semiconductor pellet 21, moreover, only one reflow device 30 is enough. Therefore, an investment cost of the reflow step can be reduced.

While the invention made by the present inventor has been specifically described based on the embodiment according to the invention, it is apparent that the present invention is not restricted to the embodiment and can variously be changed without departing from the scope of the invention.

For example, in the embodiment, the semiconductor pellet 21 is pressurized through the pusher pin 36a at the reflow step. As in a high frequency module 45 (semiconductor integrated circuit device) according to another embodiment shown in FIG. 17, a heat sink 44 to be a heat radiating plate may be pressurized by the pusher pin 36a shown in FIG. 6, thereby carrying soldering bath reflow with the chip part 22.

More specifically, the high frequency module 45 shown in FIG. 17 serves to mount the semiconductor pellet 21 acquired from a gallium-arsenic (GaAs) semiconductor wafer, for example. First of all, while the heat sink 44 is pressurized against the wiring board 2 in the main heating portion 35d shown in FIG. 4, the soldering portion 26 is heated and molten through bath reflow with the soldering reflow of the chip part 22, and furthermore, the soldering portion 26 is cooled with the heat sink 44 pressurized against the wiring board 2 in the main heating portion 35d, thereby soldering the wiring board 2, the chip part 22 and the heat sink 44. Then, the semiconductor pellet 21 is mounted on the heat sink 44 through a joint material 40 such as a silver paste.

Also in the case of the high frequency module 45, the same functions and effects as those of the soldering of the semiconductor pellet 21 according to the present embodiment can be obtained in the soldering of the heat sink 44.

The heat sink 44 is sheet-shaped, and is formed of a copper plate, for example. As shown in FIG. 17, accordingly, the high frequency module 45 has such a structure that the semiconductor pellet 21 is fixed onto the sheet-shaped heat sink 44 through the joint material 40. An assembling step to be carried out after the semiconductor pellet 21 is mounted is the same as that of the high frequency module 1 described in the above-mentioned embodiment.

In the semiconductor integrated circuit device (high frequency module 1) according to the embodiment, the chip part 22 to be an electronic part and the semiconductor pellet 21 are mounted together. The reflow technique using the reflow device 30 described in the above-mentioned embodiment can also be applied when only the semiconductor pellet 21 is mounted on the wiring board 2 or the like.

More specifically, the soldering portion 26 is heated and molten through the reflow while the semiconductor pellet 21 is pressurized against the wiring board 2 in the main heating portion 35d shown in FIG. 4, and furthermore, the soldering portion 26 of the semiconductor pellet 21 and the wiring board 2 is cooled with the semiconductor pellet 21 pressurized against the wiring board 2 in the main heating portion 35d so that the wiring board 2 and the semiconductor pellet 21 are soldered.

The semiconductor pellet 21 described in the above-mentioned embodiment may be acquired from a silicon semiconductor wafer or a gallium-arsenic semiconductor wafer, and furthermore, SOI, GeSi, TFT (Thin Film Transistor) or the like may be used.

Moreover, a nitrogen gas may be used in place of the air 29 in the above-mentioned embodiment.

Consequently, it is possible to prevent the soldering portion 26 from being oxidized during soldering.

What is claimed is:

1. A method of manufacturing a semiconductor integrated circuit device, comprising the steps of:
   (a) providing a surface mounting type electronic part and a semiconductor pellet over a wiring board;
   (b) heating and melting a connecting solder by means of batch reflow, the connecting solder being provided between the semiconductor pellet and the wiring board and between the electronic part and the wiring board, while pressurizing the semiconductor pellet against the wiring board in a heating portion capable of carrying out solder melting;
   (c) cooling a soldering portion of the semiconductor pellet and the wiring board to solder the wiring board, the electronic part and the semiconductor pellet with the semiconductor pellet pressurized against the wiring board in the heating portion; and
   (d) connecting a bonding pad of said semiconductor pellet and a terminal in the board side of said wiring board by a metal wire.

2. The method of wiring a semiconductor integrated circuit device according to claim 1, wherein the semiconductor pellet is pressurized and the electronic part is not pressurized, against the wiring board, during the heating and melting, and during the cooling.

3. The method of wiring a semiconductor integrated circuit device according to claim 1, wherein the wiring board has a surface which is at first and second levels, the second level being closer to a rear surface of the wiring board than is the first level, and the electronic part is provided on the wiring board surface at the first level and the semiconductor pellet is provided on the wiring board surface at the second level.

4. The method of wiring a semiconductor integrated circuit device according to claim 3, wherein the surface at the second level forms a cavity in the wiring board, whereby the semiconductor pellet is provided in the cavity.

5. The method of manufacturing a semiconductor integrated circuit device according to claim 1, wherein in said step (b), said connecting solder is heated and melted by a heat block which is positioned in the lower side of said semiconductor pellet.

6. The method of manufacturing a semiconductor integrated circuit device according to claim 5, wherein in said step (a), said semiconductor pellet is provided in a concave portion formed on the main surface of said wiring board.

7. A method of manufacturing a semiconductor integrated circuit device, comprising the steps of:
   (a) providing a surface mounting type electronic part and a semiconductor pellet over a wiring board;
   (b) heating and melting a connecting solder by means of batch reflow, the connecting solder being provided between the semiconductor pellet and the wiring board and between the electronic part and the wiring board, while pressurizing the semiconductor pellet against the wiring board in a heating portion capable of carrying out solder melting, and changing an amount of the pressurization during the heating and melting;
   (c) cooling a soldering portion of the semiconductor pellet and the wiring board to solder the wiring board, the electronic part and the semiconductor pellet; and
   (d) connecting a bonding pad of said semiconductor pellet and a terminal in the board side of said wiring board by a metal wire.

8. The method of manufacturing a semiconductor integrated circuit device according to claim 7, wherein in said step (b), said connecting solder is heated and melted by a heat block which is positioned in the lower side of said semiconductor pellet.

9. The method of manufacturing a semiconductor integrated circuit device according to claim 8, wherein in said step (a), said semiconductor pellet is provided in a concave portion formed on the main surface of said wiring board.

10. A method of manufacturing a semiconductor integrated circuit device, comprising the steps of:
    (a) providing a surface mounting type electronic part and a semiconductor pellet on a wiring board;
    (b) heating and melting a connecting solder by means of reflow, the connecting solder being provided between the semiconductor pellet and the wiring board and between the electronic part and the wiring board, while pressurizing the semiconductor pellet against the wiring board in a heating portion capable of carrying out solder melting;
    (c) cooling a soldering portion of the semiconductor pellet and the wiring board to solder the wiring board, the electronic part and the semiconductor pellet; and
    (d) sucking a soldering foreign substance scattered by the heating and melting, thereby removing the soldering foreign substance from the wiring board.

11. The method of manufacturing a semiconductor integrated circuit device according to claim 10, wherein after said step (d), a bonding pad of said semiconductor pellet and a terminal in the board side of said wiring board are connected by a metal wire.

12. The method of manufacturing a semiconductor integrated circuit device according to claim 11, wherein in said step (b), said connecting solder is heated and melted by a heat block which is positioned in the lower side of said semiconductor pellet.

13. A method of manufacturing a semiconductor integrated circuit device, comprising the steps of:
   (a) providing a surface mounting type electronic part and a semiconductor pellet on a wiring board having a connecting solder formed on a terminal;
   (b) heating and melting the connecting solders of the semiconductor pellet and the electronic part through batch reflow while pressurizing the semiconductor pellet against the wiring board in a heating portion capable of carrying out solder melting, and
   (c) cooling a soldering portion of the semiconductor pellet and the wiring board to solder the wiring board, the electronic part and the semiconductor pellet with the semiconductor pellet pressurized against the wiring board in the heating portion.

14. A method of manufacturing a semiconductor integrated circuit device, comprising the steps of:
   (a) providing a surface mounting type electronic part and a semiconductor pellet on a wiring board having a connecting solder formed on a terminal;
   (b) heating and melting the connecting solders of the semiconductor pellet and the electronic part through batch reflow while pressurizing the semiconductor pellet against the wiring board in a heating portion capable of carrying out solder melting; and changing an amount of the pressurization during the heating and melting; and
   (c) cooling a soldering portion of the semiconductor pellet and the wiring board to solder the wiring board, the electronic part and the semiconductor pellet with the semiconductor pellet pressurized against the wiring board in the heating portion.

15. A method of manufacturing a semiconductor integrated circuit device, comprising the steps of:
   (a) providing a surface mounting type electronic part and a semiconductor pellet on a wiring board having a connecting solder formed on a terminal;
   (b) heating and melting the connecting solders of the semiconductor pellet and the electronic part through batch reflow while pressurizing the semiconductor pellet against the wiring board in a heating portion capable of carrying out solder melting; and
   (c) cooling a soldering portion of the semiconductor pellet and the wiring board to solder the wiring board, the electronic part and the semiconductor pellet with the semiconductor pellet pressurized against the wiring board in the heating portion; and
   (d) sucking a soldering foreign substance scattered by the heating and melting, thereby removing the soldering foreign substance from the wiring board.

16. A method of manufacturing a semiconductor integrated circuit device, comprising the steps of:
   (a) providing a surface mounting type electronic part and a semiconductor pellet on a wiring board having a connecting solder formed on a terminal;
   (b) heating and melting the connecting solders of the semiconductor pellet and the electronic part through batch reflow while pressurizing the semiconductor pellet against the wiring board in a heating portion capable of carrying out solder melting, and changing an amount of the pressurization during the heating and melting;
   (c) cooling a soldering portion of the semiconductor pellet and the wiring board to solder the wiring board, the electronic part and the semiconductor pellet; and
   (d) sucking a soldering foreign substance scattered by the heating and melting, thereby removing the soldering foreign substance from the wiring board.

17. A method of manufacturing a semiconductor integrated circuit device, comprising the steps of:
   (a) providing a surface mounting type electronic part and a semiconductor pellet on a wiring board having a connecting solder formed on a terminal;
   (b) heating and melting the connecting solders of the semiconductor pellet and the electronic part through batch reflow while pressurizing the semiconductor pellet against the wiring board in a heating portion capable of carrying out solder melting, and changing an amount of the pressurization during the heating and melting;
   (c) cooling a soldering portion of the semiconductor pellet and the wiring board to solder the wiring board, the electronic part and the semiconductor pellet with the semiconductor pellet pressurized against the wiring board in the heating portion; and
   (d) sucking a soldering foreign substance scattered by the heating and melting, thereby removing the soldering foreign substance from the wiring board.

18. A method of manufacturing a semiconductor integrated circuit device, comprising the steps of:
   (a) providing a multi-device board with a plurality of wiring boards having a connecting solder formed on a terminal;
   (b) providing surface mounting type electronic parts and a plurality of semiconductor pellets on said plurality of wiring boards of the multi-device board in said heating portion;
   (c) heating and melting said connecting solder provided between said semiconductor pellets and said wiring boards and between said electronic parts and said wiring boards through batch reflow in said heating portion while pressurizing said plurality of semiconductor pellets against said wiring boards from above the individual semiconductor pellets through a plurality of pin members corresponding to the respective semiconductor pellets;
   (d) cooling a solder connecting portion between said semiconductor pellets and said wiring boards while pressurizing said semiconductor pellets against said wiring boards so as to solder and connect said wiring boards to said electronic parts and said semiconductor pellets in said heating portion; and
   (e) dividing said multi-device board into individual wiring boards.

19. The method of manufacturing a semiconductor integrated circuit device according to claim 18, wherein after said step (a), a bonding pad of said semiconductor pellet and a terminal in the board side of said wiring board are connected by a metal wire.

20. The method of manufacturing a semiconductor integrated circuit device according to claim 19, wherein in said step (a), said semiconductor pellet is provided in a concave portion formed on the main surface of said wiring board.

21. The method of manufacturing a semiconductor integrated circuit device according to claim 18, wherein in said step (b), said connecting solder is heated and melted by a heat block which is positioned in the lower side of said semiconductor pellet.

22. The method of manufacturing a semiconductor integrated circuit device according to claim 21, wherein in said step (a), said semiconductor pellet is provided in a concave portion formed on the main surface of said wiring board.

23. A method of manufacturing a semiconductor integrated circuit device, comprising the steps of:
   (a) providing surface mounting type electronic parts and a plurality of semiconductor pellets on wiring boards each corresponding to one semiconductor integrated circuit device;
   (b) heating and melting connecting solder provided between each of said plutality of semiconductor pellets and said, wiring boards and between said electronic parts and said wiring boards through batch reflow, while pressurizing said plurality of semiconductor pellets against said wiring boards in a heating portion capable of carrying out solder melting; and
   (c) cooling a solder connecting portion between said plurality of semiconductor pellets and said wiring boards in said heating portion while pressurizing said plurality of semiconductor pellets against said wiring boards so as to solder and connect said wiring boards to said electronic parts and said plurality of semiconductor pellets.

* * * * *